US011768367B2

(12) United States Patent
Lee et al.

(10) Patent No.: US 11,768,367 B2
(45) Date of Patent: Sep. 26, 2023

(54) STRUCTURES FOR PIEZOELECTRIC ACTUATOR TO INCREASE DISPLACEMENT AND MAINTAIN STIFFNESS

(71) Applicant: Beijing Voyager Technology Co., Ltd., Beijing (CN)

(72) Inventors: Sae Won Lee, Mountain View, CA (US); Youmin Wang, Mountain View, CA (US); Yufeng Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 475 days.

(21) Appl. No.: 17/001,042

(22) Filed: Aug. 24, 2020

(65) Prior Publication Data

US 2022/0057627 A1 Feb. 24, 2022

(51) Int. Cl.
*G02B 26/08* (2006.01)
*H02N 2/04* (2006.01)
*B81B 3/00* (2006.01)
*G01S 7/481* (2006.01)
*G02B 26/10* (2006.01)
*H10N 30/853* (2023.01)

(52) U.S. Cl.
CPC ........ *G02B 26/0858* (2013.01); *B81B 3/0045* (2013.01); *G01S 7/4817* (2013.01); *G02B 26/101* (2013.01); *H02N 2/043* (2013.01); *B81B 2201/042* (2013.01); *H10N 30/8554* (2023.02)

(58) Field of Classification Search
CPC .......... G02B 26/0858; G02B 26/101; B81B 3/0045; B81B 2201/042; B81B 3/007; G01S 7/4817; G01S 17/89; G01S 17/931; H02N 2/043; H01L 41/1876; H01L 41/094
See application file for complete search history.

(56) References Cited

U.S. PATENT DOCUMENTS 6,198,565 B1 3/2001 Iseki et al.
9,835,853 B1 12/2017 Shpunt et al.
11,307,404 B2 4/2022 Grutzeck et al.
(Continued)

FOREIGN PATENT DOCUMENTS

CN 110031966 A 7/2019
CN 110927960 A 3/2020
(Continued)

OTHER PUBLICATIONS

"English Machine translation of CN-110031966-A", Jul. 19, 2019, 15 pages.
(Continued)

*Primary Examiner* — Euncha P Cherry
(74) *Attorney, Agent, or Firm* — KILPATRICK TOWNSEND & STOCKTON LLP

(57) ABSTRACT

A piezoelectric actuator including an anchor, an elastic layer having a first end coupled to the anchor, and a piezoelectric layer on the elastic layer. The elastic layer includes a solid sublayer including an elastic material and a second sublayer including a plurality of cavities. The piezoelectric layer is on the second sublayer of the elastic layer and includes a top electrode, a bottom electrode, and a piezoelectric material layer between the top electrode and the bottom electrode.

18 Claims, 18 Drawing Sheets

(56) References Cited

U.S. PATENT DOCUMENTS

| | | |
|---|---|---|
| 11,360,300 B2 | 6/2022 | Ogata et al. |
| 2014/0062506 A1 | 3/2014 | Defazio et al. |
| 2016/0238834 A1 | 8/2016 | Erlich et al. |
| 2017/0005257 A1 | 1/2017 | Uchino et al. |
| 2018/0329204 A1 | 11/2018 | Smits |
| 2021/0223536 A1 | 7/2021 | Brunner et al. |
| 2021/0231865 A1 | 7/2021 | Nezhad |
| 2021/0260859 A1* | 8/2021 | Le Rhun ............... B32B 37/025 |
| 2021/0325671 A1* | 10/2021 | Ogino ................ G02B 27/0101 |

FOREIGN PATENT DOCUMENTS

| | | |
|---|---|---|
| DE | 102018219380 B4 | 11/2019 |
| DE | 102019201889 A1 | 8/2020 |
| KR | 101897234 B1 | 9/2018 |

OTHER PUBLICATIONS

"English Machine translation of CN-110927960-A", Mar. 27, 2020, 6 pages.
"English Machine translation of DE-102018219380-B4", Nov. 21, 2019, 11 pages.
"English Machine translation of DE-102019201889-A1", Aug. 13, 2020, 15 pages.
"English Machine translation of KR-101897234-B1", Sep. 10, 2018, 11 pages.
U.S. Appl. No. 17/001,030, "Non-Final Office Action", dated Mar. 28, 2023, 35 pages.
U.S. Appl. No. 17/001,038, "Non-Final Office Action", dated Nov. 30, 2022, 11 pages.

* cited by examiner

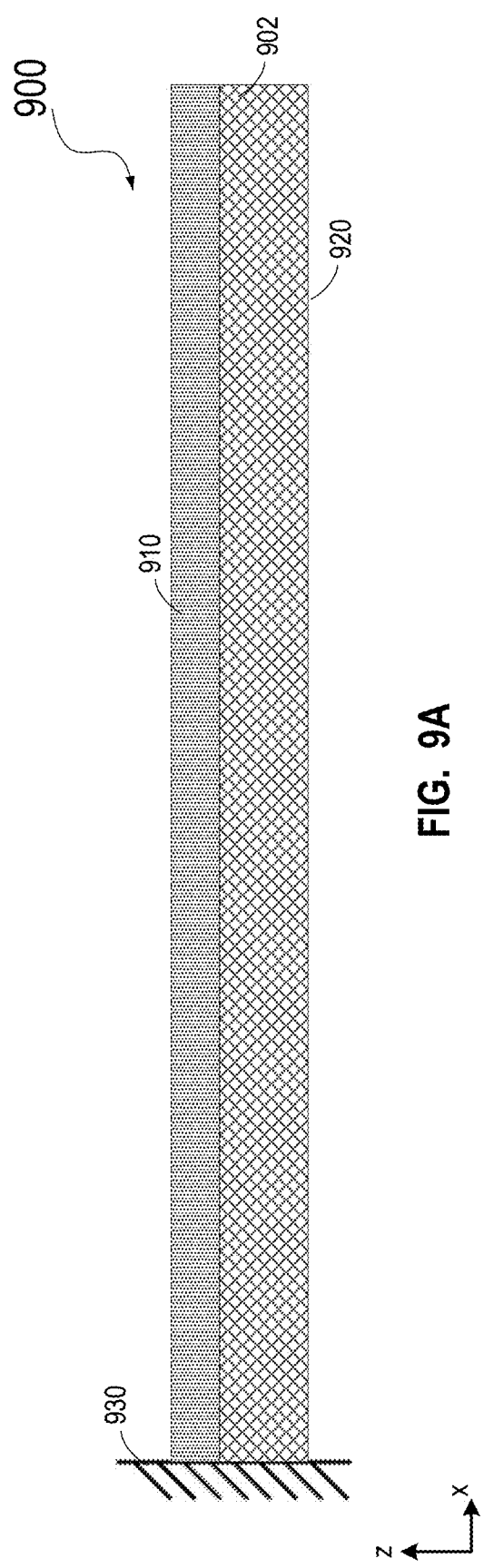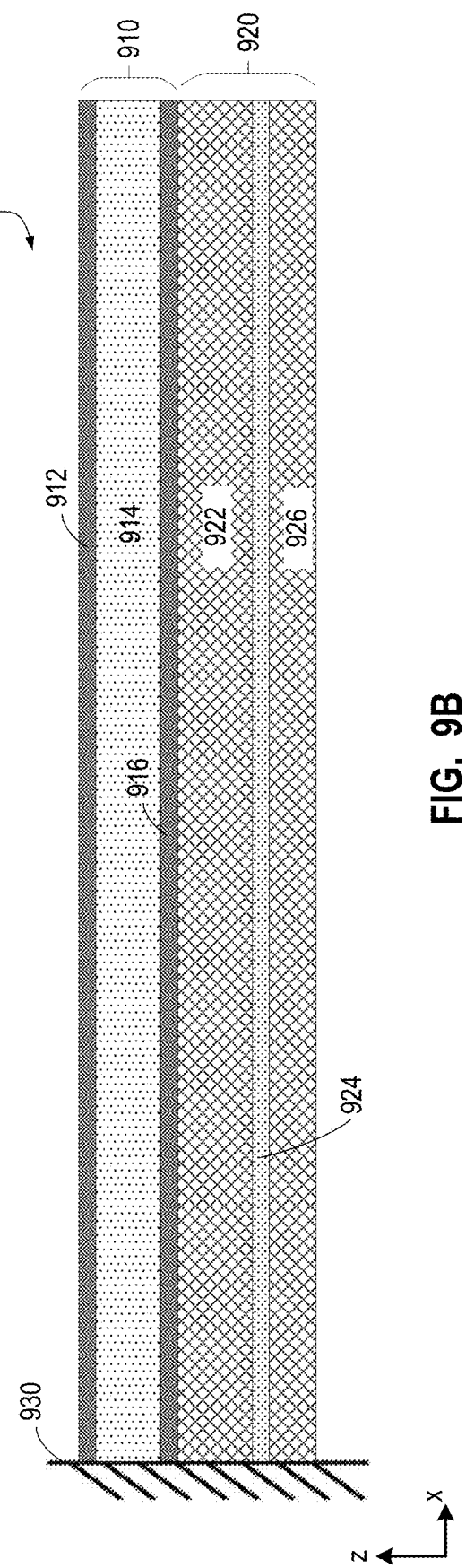
FIG. 9A
FIG. 9B

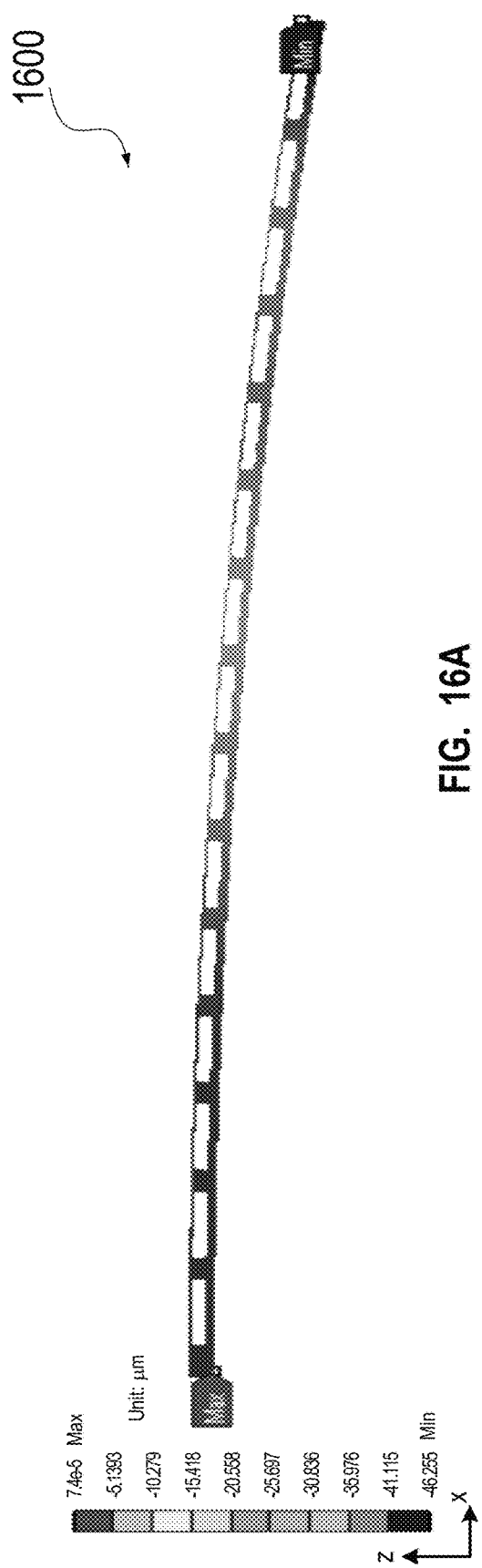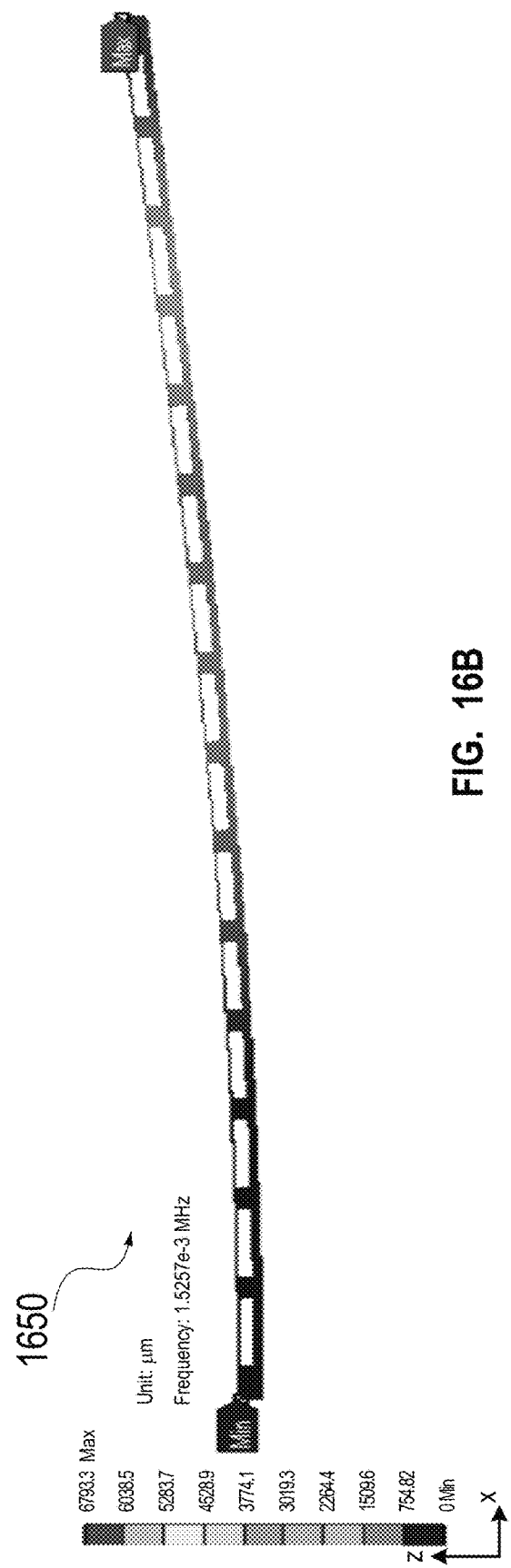
FIG. 16A
FIG. 16B

STRUCTURES FOR PIEZOELECTRIC ACTUATOR TO INCREASE DISPLACEMENT AND MAINTAIN STIFFNESS

CROSS-REFERENCES TO RELATED APPLICATIONS

The following U.S. patent applications listed below (which include the present application) are being filed concurrently, and the entire disclosures of the other applications are hereby incorporated by reference into this application for all purposes:

Application Ser. No. 17/001,042, filed Aug. 24, 2020, and entitled "Structures for Piezoelectric Actuator to Increase Displacement and Maintain Stiffness";

Application Ser. No. 17/001,038, filed Aug. 24, 2020, and entitled "MEMS Scanning Mirror With Piezoelectric Drive Mechanism"; and Application Ser. No. 17/001,030, filed Aug. 24, 2020, and entitled "Piezoelectric-Actuated Micro-Mirror With No Torsional Beam".

BACKGROUND

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

Light beam steering techniques can also be used in other optical systems, such as optical display systems (e.g., TVs), optical sensing systems, optical imaging systems, and the like. In various light beam steering systems, the light beam may be steered by, for example, a rotating platform driven by a motor, a multi-dimensional mechanical stage, a Galvo-controlled mirror, a resonant fiber, an array of microelectromechanical (MEMS) mirrors, or any combination thereof. A MEMS mirror may be rotated around a pivot or connection point by, for example, a micro-motor, an electromagnetic actuator, an electrostatic actuator, or a piezoelectric actuator.

SUMMARY

Techniques disclosed herein relate generally to microelectromechanical (MEMS) mirrors that can be used in, for example, light detection and ranging (LiDAR) systems or other light beam steering systems. More specifically, and without limitation, disclosed herein are MEMS micro-mirrors including piezoelectric actuators that include structures to achieve a large displacement while maintaining a high stiffness, thereby achieving a large scanning angle (and thus a large field of view) and a high resonant frequency (and thus a high resolution). Various inventive embodiments are described herein, including systems, modules, devices, components, circuits, materials, methods, and the like.

According to certain embodiments, a micro-mirror assembly may include a substrate, a first piezoelectric actuator coupled to the substrate, a second piezoelectric actuator coupled to the substrate, and a micro-mirror positioned between the first piezoelectric actuator and the second piezoelectric actuator. The micro-mirror may include a first edge coupled to the first piezoelectric actuator, and a second edge opposing the first edge and coupled to the second piezoelectric actuator. Each of the first piezoelectric actuator and the second piezoelectric actuator may include an elastic layer and a piezoelectric layer on the elastic layer. The elastic layer may include a solid sublayer of an elastic material and a second sublayer including a plurality of cavities, where the piezoelectric layer may be on the second sublayer of the elastic layer.

In some embodiments of the micro-mirror assembly, the plurality of cavities may include a one-dimensional array or a two-dimensional array of cavities. Each of the plurality of cavities may be characterized by a height greater than a threshold value or greater than a half of a thickness of the solid sublayer of the elastic layer. In some embodiments, the micro-mirror may include a gimbal structure. In some embodiments, the first edge of the micro-mirror may be coupled to the first piezoelectric actuator by a connection spring.

In some embodiments, the piezoelectric layer may include a top electrode, a bottom electrode, and a piezoelectric material layer between the top electrode and the bottom electrode. The piezoelectric layer may be in physical contact with the second sublayer of the elastic layer. In some embodiments, the elastic layer may further include a top sublayer on the second sublayer, and the piezoelectric layer may be in physical contact with the top sublayer of the elastic layer. In some embodiments, the elastic layer may also include a third sublayer including a second plurality of cavities, where the solid sublayer may be between the second sublayer and the third sublayer. In some embodiments, the elastic layer may also include a second top sublayer on the third sublayer. Each of the first piezoelectric actuator and the second piezoelectric actuator may further include a second piezoelectric layer coupled to the third sublayer of the elastic layer (e.g., directly or through the second top layer).

According to certain embodiments, a piezoelectric actuator may include an anchor, an elastic layer having a first end coupled to the anchor, and a piezoelectric layer on the elastic layer. The elastic layer may include a solid sublayer including an elastic material and a second sublayer including a plurality of cavities. The piezoelectric layer may be on the second sublayer of the elastic layer and may include a top electrode, a bottom electrode, and a piezoelectric material layer between the top electrode and the bottom electrode.

In some embodiments, the plurality of cavities may include a one-dimensional array or a two-dimensional array of cavities. Each of the plurality of cavities may be characterized by a height greater than a threshold value or greater than a half of a thickness of the solid sublayer. In some embodiments, the piezoelectric layer may be in physical contact with the second sublayer of the elastic layer. In some embodiments, the elastic layer may also include a top sublayer on the second sublayer, and the piezoelectric layer may be in physical contact with the top sublayer of the elastic layer.

In some embodiments, the elastic layer may also include a third sublayer that includes a second plurality of cavities, where the solid sublayer may be between the second sublayer and the third sublayer. In some embodiments, the elastic layer may also include a second top sublayer on the third sublayer. The piezoelectric actuator may further include a second piezoelectric layer coupled to the third sublayer of the elastic layer (e.g., directly or through the second top layer).

In some embodiments, the elastic layer may include a second movable end opposing the first end. The piezoelectric layer may be configured to, upon receiving a voltage signal at the top electrode and the bottom electrode, bend the elastic layer such that the second movable end of the elastic layer oscillates at a resonant frequency. The resonant frequency may be greater than 1 KHz. The elastic material may include, for example, at least one of polysilicon, silicon oxide, or silicon nitride. The piezoelectric material layer may include, for example, lead zirconate titanate ceramic. The anchor may include a substrate.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

Aspects and features of the various embodiments will be more apparent by describing examples with reference to the accompanying drawings, in which like reference numerals refer to like components or parts throughout the drawings.

FIG. 3A illustrates an example of a beam steering operation by the LiDAR system according to certain embodiments. FIG. 3B illustrates an example of a returned beam detection operation by the LiDAR system according to certain embodiments.

FIG. 9A illustrates a simplified example of a piezoelectric actuator. FIG. 9B illustrates a layer stack-up of an example of a piezoelectric actuator shown in FIG. 9A.

FIG. 16A illustrates simulated directional displacements of an example of a piezoelectric actuator according to certain embodiments. FIG. 16B illustrates simulated total displacements and the resonant frequency of an example of a piezoelectric actuator according to certain embodiments.

Figure 1:
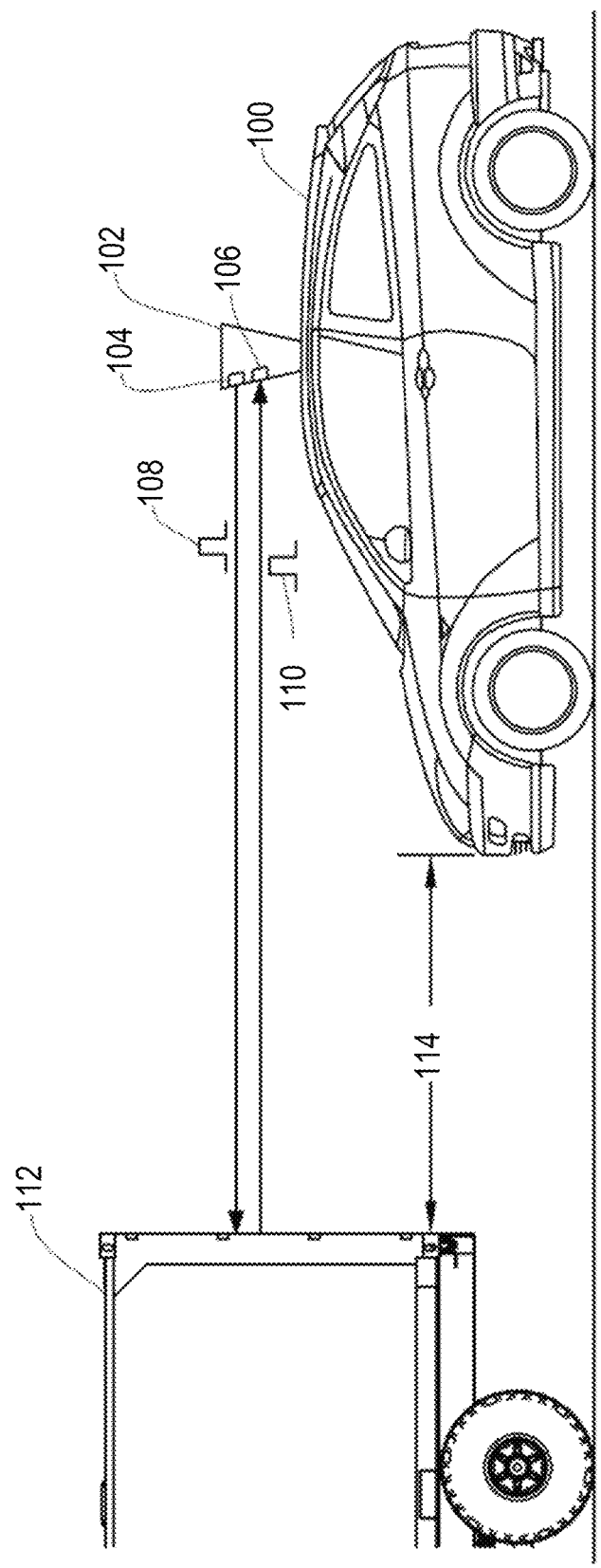
FIG. 1 illustrates an example of a vehicle including a light detection and ranging (LiDAR) system according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

DETAILED DESCRIPTION

Techniques disclosed herein relate generally to micro-mirrors, such as microelectromechanical (MEMS) mirrors, that can be used in light beam steering systems, such as light detection and ranging (LiDAR) systems. More specifically, and without limitation, disclosed herein are piezoelectric actuators for rotating micro-mirrors. The piezoelectric actuators include structures to achieve a large displacement and maintain a high stiffness, thereby achieving a large range of light scanning angles (and thus a large field of view) and a high resonant frequency (and therefore a high resolution). Various inventive embodiments are described herein, including systems, modules, devices, components, circuits, materials, methods, code, or instructions executable by one or more processors, and the like.

A light steering system, such as a LiDAR system, may include a transmitter subsystem that transmits and scans light beams (e.g., infrared light beams), and/or a receiver subsystem that receives and scans light beam from objects (e.g., people, animals, and automobiles) and environmental features (e.g., trees and building structures). For example, a LiDAR system carried by a vehicle may be used to determine the vehicle's relative position, speed, and direction with respect to other objects or environmental features based on a point cloud generated by the LiDAR system, and thus may, in some cases, be used for autonomous driving, auto-piloting, driving assistance, parking assistance, collision avoidance, and the like.

In some light steering systems, the transmitted or received light beam may be steered by an array of micro-mirrors. Each micro-mirror may rotate around a pivot or connection point to deflect light incident on the micro-mirror to desired directions. The performance of the micro-mirrors may directly affect the performance of the light steering system, such as the field of view (FOV), the quality of the point cloud, and the quality of the image generated using a light steering system. For example, to increase the detection range and the FOV of a LiDAR system, micro-mirrors with large rotation angles and large apertures may be used, which may cause an increase in the maximum displacement and the moment of inertia of the micro-mirrors. To achieve a high resolution, a device with a high resonant frequency may be used, which may be achieved using a rotating structure with a high stiffness. It may be difficult to achieve this desired performance using electrostatic actuated micro-mirrors because comb fingers used in an electrostatic actuated micro-mirror may not be able to provide the force and moment needed and may disengage at large rotation angles, in particular, when the aperture of the micro-mirror is increased to improve the detection range. Some piezoelectric actuators may be able to achieve large displacements and large scanning angles. However, piezoelectric actuators that can achieve larger displacements may often have lower stiffness, and thus may have lower resonant frequencies and lower resolutions.

According to certain embodiments, a piezoelectric actuator may include an elastic layer and a piezoelectric layer adjacent to the elastic layer to bend the elastic layer. The elastic layer may include a solid sublayer and a sublayer with cavities between the solid sublayer and the piezoelectric layer to increase the force arm of the piezoelectric layer on the solid sublayer of the elastic layer, thereby increasing the displacement of elastic layer. For example, the elastic layer may include a battlement-shaped portion or may include some internal cavities. The sublayer of the elastic layer with cavities may also help to increase the overall stiffness of the elastic layer, and thus may increase the resonant frequency of the piezoelectric actuator and the resolution of the micro-mirror driven by the piezoelectric actuator.

Conceptual overview of certain embodiments of MEMS-based micro-mirror systems including one or more piezoelectric actuators that can address the problems described above are provided herein. This overview is not intended to identify key or essential features of the figures or the claimed subject matter, nor is it intended to be used in isolation to determine the scope of the claimed subject matter. Each figure referred to in this overview is further described below in greater detail and for broader application. MEMS-based micro-mirrors disclosed herein can be configured to perform light steering in various examples of light steering systems, such as those shown and described below in detail with respect to FIGS. 1-4. For instance, the MEMS-based micro-mirrors systems described herein can be a part of a transmitter configured to control a scanning angle of a transmitted light beam or part of a receiver configured to select an angle of returned light beam for object detection. Some embodiments may employ a coaxial configuration such that the light steering system can project output light to a location and receive returned light reflected from the same location, as would be appreciated by one of ordinary skill in the art with the benefit of this disclosure.

Figure 5A:
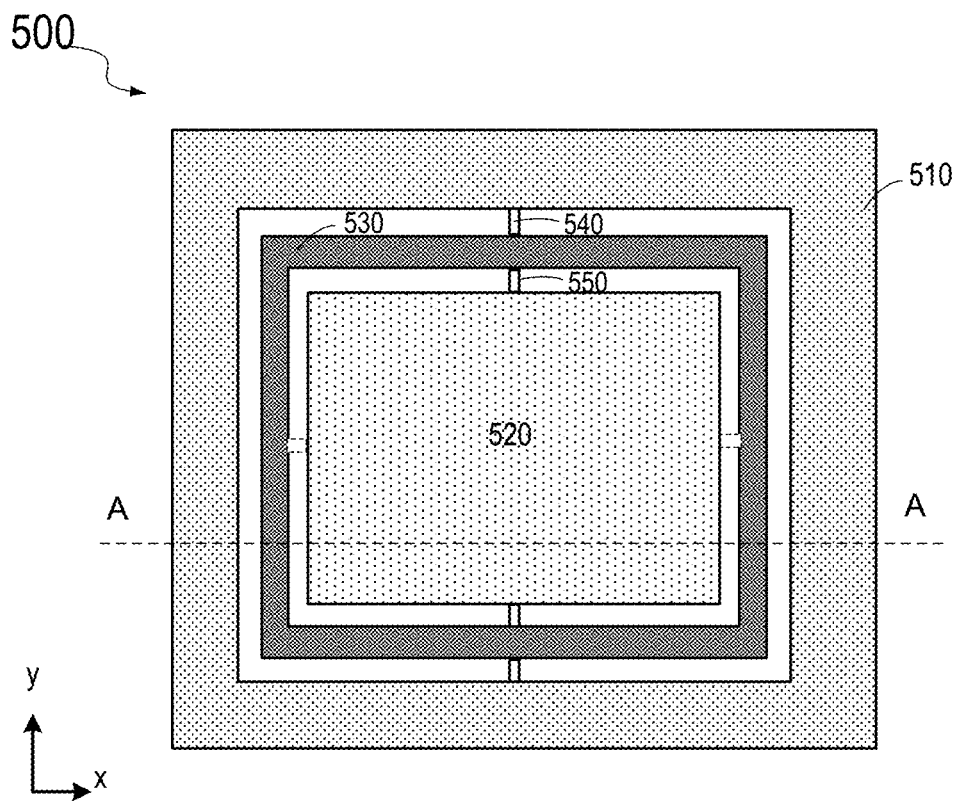
FIG. 5A illustrates an example of a rotatable micro-mirror assembly according to certain embodiments.
Figure 5B:
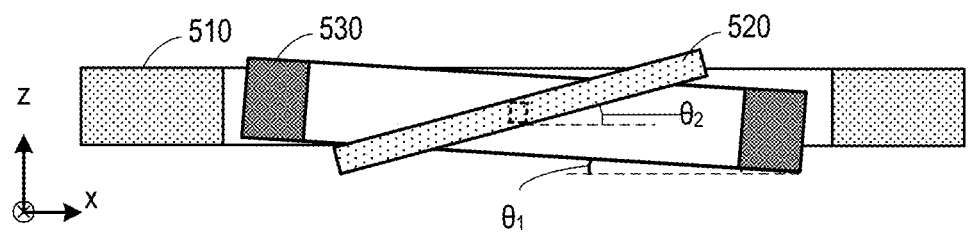
FIG. 5B includes a cross-sectional view of the example of the rotatable micro-mirror assembly shown in FIG. 5A.
Figures 6A, 6B:
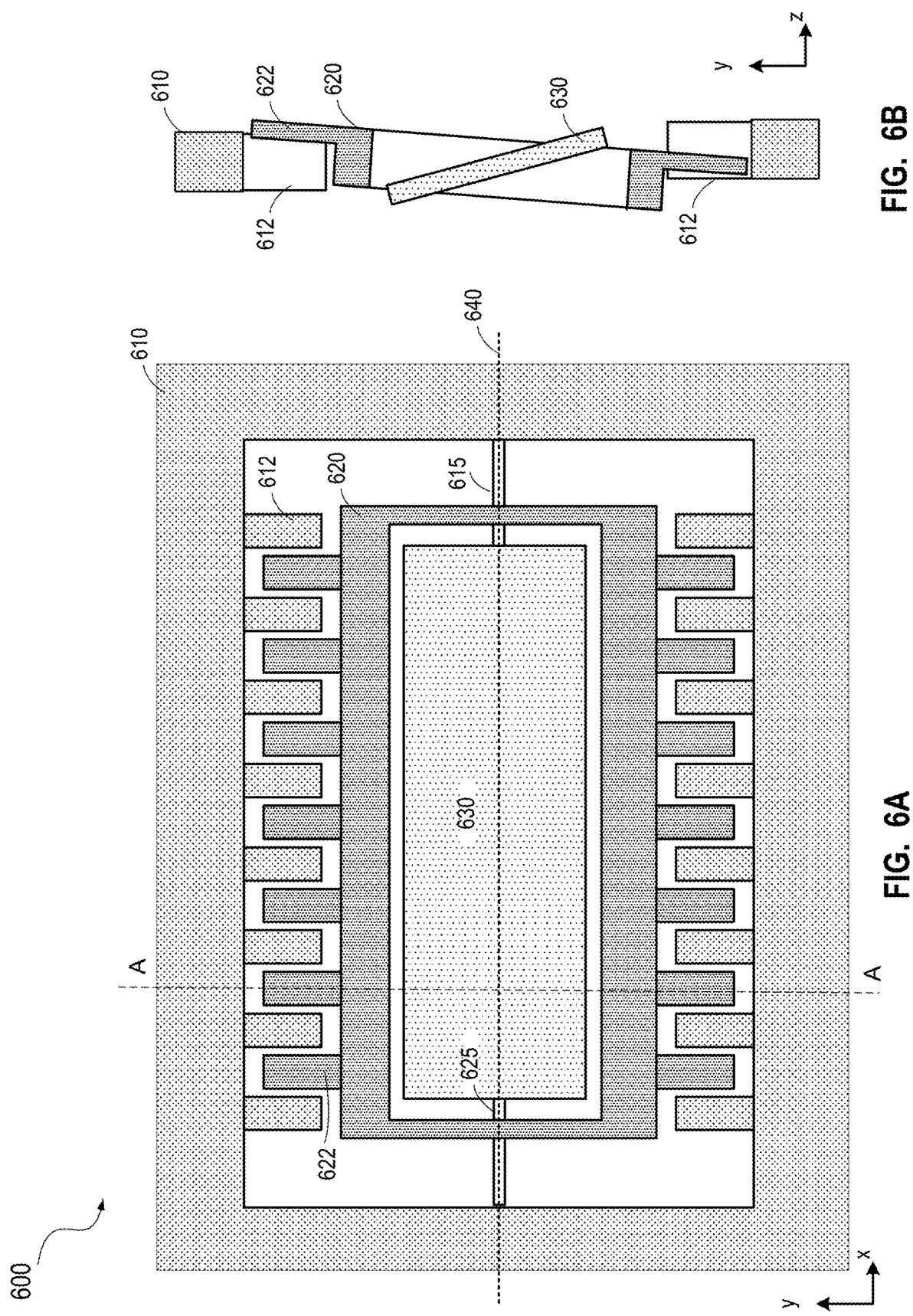
FIG. 6A illustrates an example of a rotatable micro-mirror assembly including electrostatic actuators.
FIG. 6B includes a cross-sectional view of the example of the rotatable micro-mirror assembly shown in FIG. 6A.

A micro-mirror in a MEMS-based micro-mirror system may be rotated around an actual or virtual pivot or connection point (e.g., a torsional beam or a rotational axis) by an actuator shown in, for example, FIGS. 5A and 5B, such as a micro-motor, an electromagnetic actuator, an electrostatic actuator, or an acoustic actuator. FIGS. 6A-6B show an example of rotating micro-mirrors using electrostatic actuators, which use the attractive or repulsive Coulomb force between charges on a moving part and a stationary part to cause relative movements of the moving part with respect to the stationary part. In MEMS-based micro-mirror systems that use electrostatic actuators, the rotation angle and thus the field of view may be limited in order to keep the moving part and the stationary part engaged to apply the Coulomb force. In particular, for micro-mirrors with large sizes (e.g., in order to increase the intensity of the transmitted and/or received light for long-range detection), the rotation angle that can be achieved may be relatively small because of the large displacement for even small rotation angles. As such, some electrostatic actuators may not provide enough force or torque to start and maintain the mirror oscillations, and/or may not achieve a large rotation angle (because of the large displacement) and a high resonant frequency (due to large moment of inertia caused by large mirror and the actuator fingers).

In some embodiments, piezoelectric actuators as described in, for example, FIGS. 7A-8B, may be used in rotatable micro-mirror assemblies to achieve the large displacements and large rotation angles. The piezoelectric actuators may physically connect the micro-mirrors and/or frames to fixation points and thus may not have the disengagement issue associated with electrostatic actuators. In addition, the piezoelectric actuators can be used as torsional structures such that additional torsional structures may or may not be needed.

A piezoelectric actuator generally includes a bimorph structure that includes an elastic layer and a piezoelectric layer as shown in, for example, FIGS. 9A-9B. When a voltage signal is applied to the piezoelectric layer, the piezoelectric layer may expand or contract, which may cause the elastic layer that is attached to the piezoelectric layer to bend downward or upward. Because the piezoelectric layer may be directly on top of the elastic layer, the force arm or the moment arm of the piezoelectric layer for bending the elastic layer may be relatively small. To achieve a large displacement and thus a large rotational angle, the bending stiffness of the piezoelectric actuator may need to be low, which may correspond to a lower resonant frequency and a lower resolution.

According to certain embodiments, an improved piezoelectric actuator may include a piezoelectric layer and an elastic layer that includes a solid sublayer and a sublayer with cavities between the solid sublayer and the piezoelectric layer. The sublayer with cavities may increase the distance between of the piezoelectric layer and the solid sublayer of the elastic layer, thereby increasing the force arm and the bending moment of the piezoelectric layer on the solid sublayer of the elastic layer. Therefore, the displacement of the movable end of the elastic layer can be increased. As a result, a large scanning angle and field of view may be achieved by a micro-mirror driven by the piezoelectric actuator. The sublayer with cavities can also help to increase the overall stiffness of the piezoelectric actuator, thereby increasing the resonant frequency of the piezoelectric actuator and the beam scanning resolution of the micro-mirror driven by the piezoelectric actuator. FIGS. 10A-11B show examples of the improved piezoelectric actuator. In one example shown in FIG. 10A, the elastic layer may be battlement-shaped, and the piezoelectric layer may be partially suspended, where the portion of the elastic layer that supports the piezoelectric layer may act as the force arm for bending the solid sublayer of the elastic layer.

Examples of Finite Element Analysis (FEA) simulation results are shown in FIGS. 12A-16B. The FEA simulation results confirm that the piezoelectric actuator structures disclosed herein can achieve a much higher displacement than a conventional piezoelectric actuator that has a similar stiffness or resonant frequency. For example, a piezoelectric actuator according to techniques disclosed herein can achieve a directional (e.g., vertical) displacement about 46.26 μm and a resonant frequency about 1525 Hz, whereas a conventional piezoelectric actuator having a similar physical size and resonant frequency (e.g., about 1505.8 Hz) may only achieve a vertical displacement about 24.34 μm. The simulation results also indicate that a piezoelectric actuator according to techniques disclosed herein can achieve a much higher resonant frequency than a conventional piezoelectric actuator having a similar or lower vertical displacement.

In the following description, for the purposes of explanation, specific details are set forth in order to provide a thorough understanding of examples of the disclosure. It will be apparent that various examples may be practiced without these specific details. The ensuing description provides examples only, and is not intended to limit the scope, applicability, or configuration of the disclosure. Rather, the ensuing description of the examples will provide those skilled in the art with an enabling description for implementing an example. It should be understood that various changes may be made in the function and arrangement of elements without departing from the spirit and scope of the disclosure as set forth in the appended claims. The figures and description are not intended to be restrictive. Circuits, systems, networks, processes, and other components may be shown as components in block diagram form in order not to obscure the examples in unnecessary detail. In other instances, well-known circuits, processes, algorithms, structures, and techniques may be shown without unnecessary detail in order to avoid obscuring the examples. The teachings disclosed herein can also be applied to various types of applications such as mobile applications, non-mobile applications, desktop applications, web applications, enterprise applications, and the like. Further, the teachings of this disclosure are not restricted to a particular operating environment (e.g., operating systems, devices, platforms, and the like) but instead can be applied to multiple different operating environments.

Furthermore, examples may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

Where components are described as being "configured to" perform certain operations, such configuration may be accomplished, for example, by designing electronic circuits or other hardware to perform the operation, by programming or controlling electronic circuits (e.g., microprocessors, or other suitable electronic circuits) to perform the operation, or any combination thereof.

The word "example" or "exemplary" is used herein to mean "serving as an example, instance, or illustration." Any embodiment or design described herein as "exemplary" or "example" is not necessarily to be construed as preferred or advantageous over other embodiments or designs.

Light beam steering techniques can be used in many optical systems, such as optical display systems, optical sensing and detecting systems, optical imaging systems, and the like. For example, a LiDAR system is an active remote sensing system that can be used to obtain the range from a transmitter to one or more points on a target in a field of view (FOV). A LiDAR system uses a light beam, typically a laser beam, to illuminate the one or more points on the target. Compared with other light sources, a laser beam may propagate over long distances without spreading significantly (highly collimated), and can be focused to small spots so as to deliver high optical power densities and provide fine resolution. The laser beam may be modulated such that the transmitted laser beam may include a series of pulses. The transmitted laser beam may be directed to a point on the target, which may then reflect or scatter the transmitted laser beam. The laser beam reflected or scattered from the point on the target back to the LiDAR system can be measured, and the time of flight (ToF) from the time a pulse of the transmitted light beam is transmitted from the transmitter to the time the pulse arrives at a receiver near the transmitter or at a known location may be measured. The range from the transmitter to the point on the target may then be determined by, for example, r=c×t/2, where r is the range from the transmitter to the point on the target, c is the speed of light in free space, and t is the ToF of the pulse of the light beam from the transmitter to the receiver.

A LiDAR system may include, for example, a single-point scanning system or a single-pulse flash system. A single-point scanning system may use a scanner to direct a pulsed light beam (e.g., a pulsed laser beam) to a single point in the field of view at a time and measure the reflected or backscattered light beam with a photodetector. The scanner may then slightly tilt the pulsed light beam to illuminate the next point, and the process may be repeated to scan the full field of view. A flash LiDAR system, on the other hand, may transmit a wider-spread light beam and use a photodiode array (e.g., a focal-plane array (FPA)) to measure the reflected or backscattered light at several points simultaneously. Due to the wider beam spread, a flash LiDAR system may scan a field of view faster than a single-point scanning system, but may need a much more powerful light source to simultaneously illuminate a larger area.

FIG. 1 illustrates an example of a vehicle 100 including a LiDAR system 102 according to certain embodiments. LiDAR system 102 may allow vehicle 100 to perform object detection and ranging in the surrounding environment. Based on the result of the object detection and ranging, vehicle 100 may, for example, automatically maneuver (with little or no human intervention) to avoid a collision with an object in the environment. LiDAR system 102 may include a transmitter 104 and a receiver 106. In some embodiments, transmitter 104 and receiver 106 may share at least some optical components. For example, in a coaxial LiDAR system, the outgoing light from transmitter 104 and returned light to receiver 106 may be directed by a same scanning system and may at least partially overlap in space.

Transmitter 104 may direct one or more light pulses 108 (or a frequency modulated continuous wave (FMCW) light signal, an amplitude modulated continuous wave (AMCW) light signal, etc.), at various directions at different times according to a suitable scanning pattern. Receiver 106 may detect returned light pulses 110, which may be portions of transmitted light pulses 108 that are reflected or scattered by one or more areas on one or more objects. LiDAR system 102 may detect the object based on the detected light pulses 110, and may also determine a range (e.g., a distance) of each area on the detected objects based on a time difference between the transmission of a light pulse 108 and the reception of a corresponding light pulse 110, which is referred to as the time of flight. Each area on a detected object may be represented by a data point that is associated with a 2-D or 3-D direction and distance with respect to LiDAR system 102.

The above-described operations can be repeated rapidly for many different directions. For example, the light pulses can be scanned using various scanning mechanisms (e.g., spinning mirrors or MEMS devices) according to a one-dimensional or two-dimensional scan pattern for two-dimensional or three-dimensional detection and ranging. The collection of the data points in the 2-D or 3-D space may form a "point cloud," which may indicate, for example, the direction, distance, shape, and dimensions of a detected object relative to the LiDAR system.

In the example shown in FIG. 1, LiDAR system 102 may transmit light pulse 108 towards a field in front of vehicle 100 at time T1, and may receive, at time T2, a returned light pulse 110 that is reflected by an object 112 (e.g., another vehicle). Based on the detection of light pulse 110, LiDAR system 102 may determine that object 112 is in front of vehicle 100. In addition, based on the time difference between T1 and T2, LiDAR system 102 may determine a distance 114 between vehicle 100 and object 112. LiDAR system 102 may also determine other useful information, such as a relative speed and/or acceleration between two vehicles and/or the dimensions of the detected object (e.g., the width or height of the object), based on additional light pulses detected. As such, vehicle 100 may be able to adjust its speed (e.g., slowing down, accelerating, or stopping) to avoid collision with other objects, or may be able to control other systems (e.g., adaptive cruise control, emergency brake assist, anti-lock braking systems, or the like) based on the detection and ranging of objects by LiDAR system 102.

LiDAR systems may detect objects at distances ranging from a few meters to more than 200 meters. Because of its ability to collimate laser light and its short wavelength (e.g., about 905 nm to about 1,550 nm), LiDAR using infrared (IR) light may achieve a better spatial or angular resolution (e.g., on the order of 0.1°) for both azimuth and elevation than radars, thereby enabling better object classification. This may allow for high-resolution 3D characterization of objects in a scene without significant backend processing. In contrast, radars using longer wavelengths, for example, about 4 mm for about 77 GHz signals, may not be able to resolve small features, especially as the distance increases. LiDAR systems may also have large horizontal (azimuth) FOVs, and better vertical (elevation) FOVs than radars. LiDAR systems can have very high performance at night. LiDAR systems using modulated LiDAR techniques may be robust against interference from other sensors.

The strength or signal level of the returned light pulses may be affected by many factors, including, but not limited to, the transmitted light signal strength, the light incident angle on an object, the object reflection or scattering characteristics, the attenuation by the propagation medium, the system front end gain or loss, the loss caused by optical components in LiDAR system 102, and the like. The noise floor may be affected by, for example, the ambient light level and front end gain settings. Generally, in a LiDAR system, the signal-to-noise ratio (SNR) of the measured signal for middle and long ranges may decrease with the increase in the distance of detection. For objects in a certain short or middle range (e.g., about 20 m), the signal levels of the returned light pulses may be much higher compared with the ambient noise level, and thus the SNR of the detection signal of the photodetector can be relatively high. On the other hand, light pulse signals returned from long ranges (e.g., about 200 m) may be significantly weaker and may have signal strength levels similar to the ambient noise level and thus a low SNR, or may not even be detected by some low sensitivity photodetectors. In addition, some LiDAR systems may have difficulty detecting objects at close distances because the time of flight is short and the LiDAR optics may be configured for middle to long range detection. For example, without a more complex assembly, one set of lenses may not be good for both short distances (e.g., <1 m) and long distances (e.g., >40 m).

Thus, even though not shown in FIG. 1, in some embodiments, vehicle 100 may include other sensors at various locations, such as, for example, cameras, ultrasonic sensors, radar sensors (e.g., short- and long-range radars), a motion sensor or an inertial measurement unit (IMU, e.g., an accelerometer and/or a gyroscope), a wheel sensor (e.g., a steering angle sensor or rotation sensor), a GNSS receiver (e.g., a GPS receiver), and the like. Each of these sensors may generate signals that provide information relating to vehicle 100 and/or the surrounding environment. Each of the sensors may send and/or receive signals (e.g., signals broadcast into the surrounding environment and signals returned from the ambient environment) that can be processed to determine attributes of features (e.g., objects) in the surrounding environment. LiDARs, radars, ultrasonic sensors, and cameras each have their own advantages and disadvantages. Highly or fully autonomous vehicles typically use multiple sensors to create an accurate long-range and short-range map of a vehicle's surrounding environment, for example, using sensor fusion techniques. In addition, it is also desirable to have sufficient overlap of coverage by the different sensors in order to increase redundancy and improve safety and reliability.

The cameras may be used to provide visual information relating to vehicle 100 and/or its surroundings, for example, for parking assistance, traffic sign recognition, pedestrian detection, lane markings detection and lane departure warning, surround view, and the like. The cameras may include a wide-angle lens, such as a fisheye lens that can provide a large (e.g., larger than 150°) angle of view. Multiple cameras may provide multiple views that can be stitched together to form an aggregated view. For example, images from cameras located at each side of vehicle 100 can be stitched together to form a 360° view of the vehicle and/or its surrounding environment. Cameras are cost-efficient, easily available, and can provide color information. However, cameras may depend strongly on the ambient light conditions, and significant processing may need to be performed on the captured images to extract useful information.

In some embodiments, vehicle 100 may include ultrasonic sensors on the front bumper, the driver side, the passenger side, and/or the rear bumper of vehicle 100. The ultrasonic sensors may emit ultrasonic waves that can be used by the vehicle control system to detect objects (e.g., people, structures, and/or other vehicles) in the surrounding environment. In some embodiments, the vehicle control system may also use the ultrasonic waves to determine speeds, positions (including distances), and/or other attributes of the objects relative to vehicle 100. The ultrasonic sensors may also be used, for example, for parking assistance. Ultrasonic waves may suffer from strong attenuation in air beyond a few meters. Therefore, ultrasonic sensors are primarily used for short-range object detection.

An IMU may measure the speed, linear acceleration or deceleration, angular acceleration or deceleration, or other parameters related to the motion of vehicle 100. A wheel sensor may include, for example, a steering angle sensor that measures the steering wheel position angle and rate of turn, a rotary speed sensor that measures wheel rotation speed, or another wheel speed sensor.

Radar sensors may emit radio frequency waves that can be used by the vehicle control system to detect objects (e.g., people, structures, and/or other vehicles) in the surrounding environment. In some embodiments, the vehicle control system may use the radio frequency waves to determine speeds, positions (including distances), and/or other attributes of the objects. The radar sensors may include long-range radars, medium-range radars, and/or short-range radars, and may be used, for example, for blind spot detection, rear collision warning, cross traffic alert, adaptive cruise control, and the like.

Figure 2:
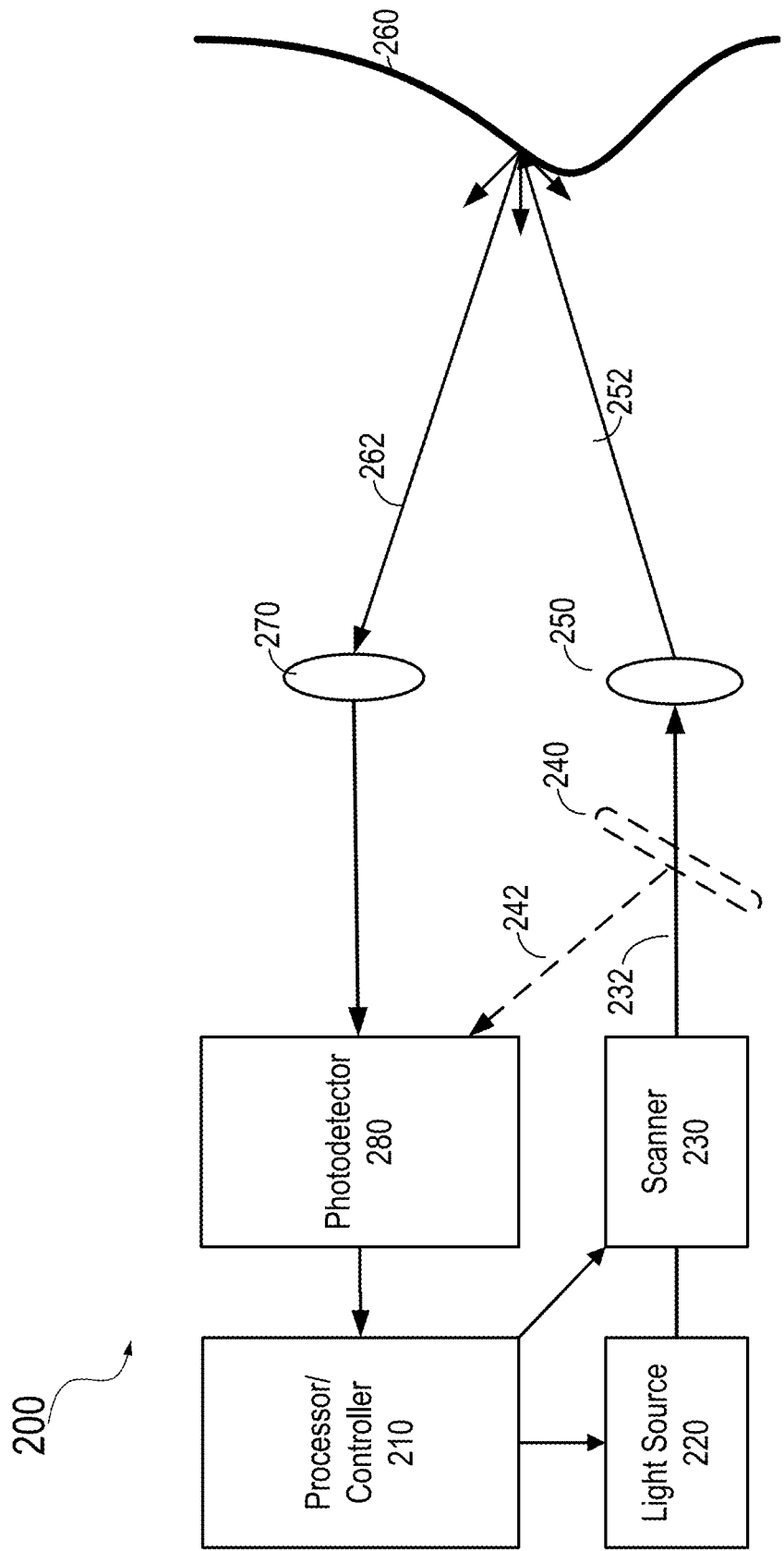
FIG. 2 is a simplified block diagram of an example of a LiDAR system according to certain embodiments.

FIG. 2 is a simplified block diagram of an example of a LiDAR system 200 according to certain embodiments. LiDAR system 200 may include a transmitter that may include a processor/controller 210, a light source 220, a scanner 230 for scanning an output light beam from light source 220, and a transmitter lens 250. Light source 220 may include, for example, a laser, a laser diode, a vertical cavity surface-emitting laser (VCSEL), a light-emitting diode (LED), or other optical sources. The laser may include, for example, an infrared pulsed fiber laser or other mode-locked laser with an output wavelength of, for example, 930-960 nm, 1030-1070 nm, around 1550 nm, or longer. Processor/controller 210 may control light source 220 to transmit light pulses. Scanner 230 may include, for example, a rotating platform driven by a motor, a multi-dimensional mechanical stage, a Galvo-controlled mirror, a microelectromechanical (MEMS) mirror driven by micro-motors, a piezoelectric translator/transducer using a piezoelectric material such as a quartz or lead zirconate titanate (PZT) ceramic, an electro-magnetic actuator, a resonant fiber scanner, or an acoustic actuator. In one example, LiDAR system 200 may include a single-point scanning system that uses a micro-electro-mechanical system (MEMS) combined with a mirror to reflect a pulsed light beam to a single point in the field of view. In some embodiments, scanner 230 may not include a mechanically moving component, and may use, for example, a phased array technique where phases of an array of light beams (e.g., from lasers in a one-dimensional (1-D) or two-dimensional (2-D) laser array) may be modulated to alter the wavefront of the superimposed light beam. Transmitter lens 250 may direct a light beam 232 towards a target 260 as shown by light beam 252.

LiDAR system 200 may include a receiver that may include a receiver lens 270, a photodetector 280, and processor/controller 210. Reflected or scattered light beam 262 from target 260 may be collected by receiver lens 270 and directed to photodetector 280. Photodetector 280 may include a detector having a working (sensitive) wavelength comparable with the wavelength of light source 220. Photodetector 280 may be a high speed photodetector, such as a PIN photodiode with an intrinsic region between a p-type semiconductor region and an n-type semiconductor region, a silicon photomultiplier (SiPM) sensor, an avalanche photodetector (APD), and the like. Processor/controller 210 may be used to synchronize and control the operations of light source 220, scanner 230, and photodetector 280, and analyze measurement results based on the control signals for light source 220 and scanner 230, and the signals detected by photodetector 280.

In some embodiments, a beam splitter 240 may split light beam 232 from scanner 230 and direct a portion of light beam 232 towards photodetector 280 as shown by light beam 242 in FIG. 2. Light beam 242 may be directed to photodetector 280 by beam splitter 240 directly or indirectly through one or more mirrors. In some embodiments, the light beam from the light source may be split and directed to the receiver before entering scanner 230. By partially directing the transmitted pulses near the transmission source to photodetector 280, the pulses captured by photodetector 280 immediately after transmission can be used as the transmitted pulses or reference pulses for determining the time of flight. To measure the time of flight, approximate positions of transmitted and returned pulses must be identified within the waveform of the detection signal of photodetector 280. A LiDAR system may use, for example, a leading-edge detector, a peak detector, or a matched-filter detector, to recover transmitted and/or returned light pulses in the detection signal from the photodetector.

In the example illustrated in FIG. 2, LiDAR system 200 may be a non-coaxial LiDAR system, where the receiver and the transmitter may use different optical components, and the outgoing light and the returned light may not spatially overlap. In some embodiments, the LiDAR systems may be coaxial systems, where, for example, the outgoing light and the returned light may be scanned by a same scanner and may at least spatially overlap at the scanner.

Figure 3A:
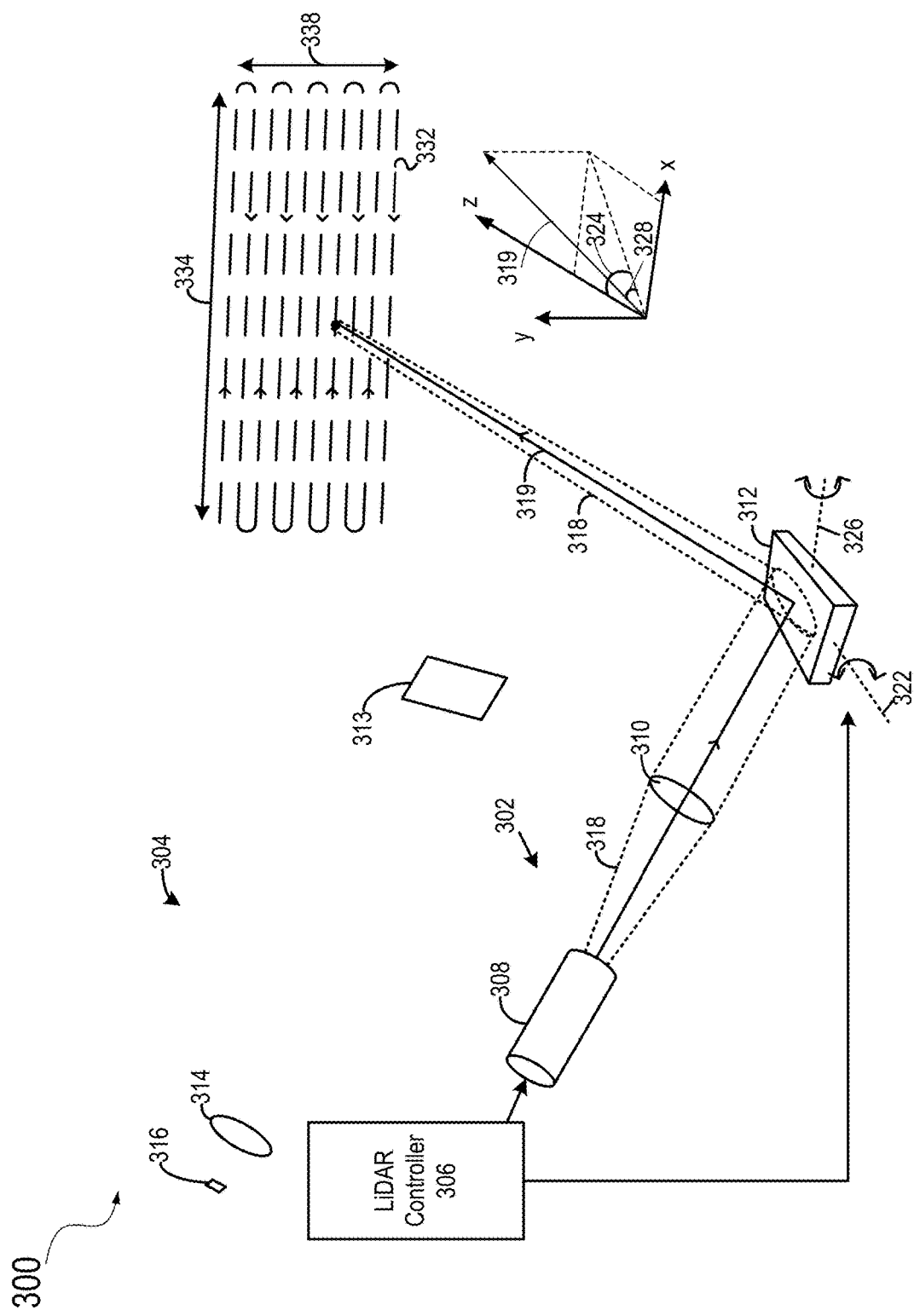
FIGS. 3A and 3B illustrate an example of a LiDAR system according to certain embodiments.
Figure 3B:
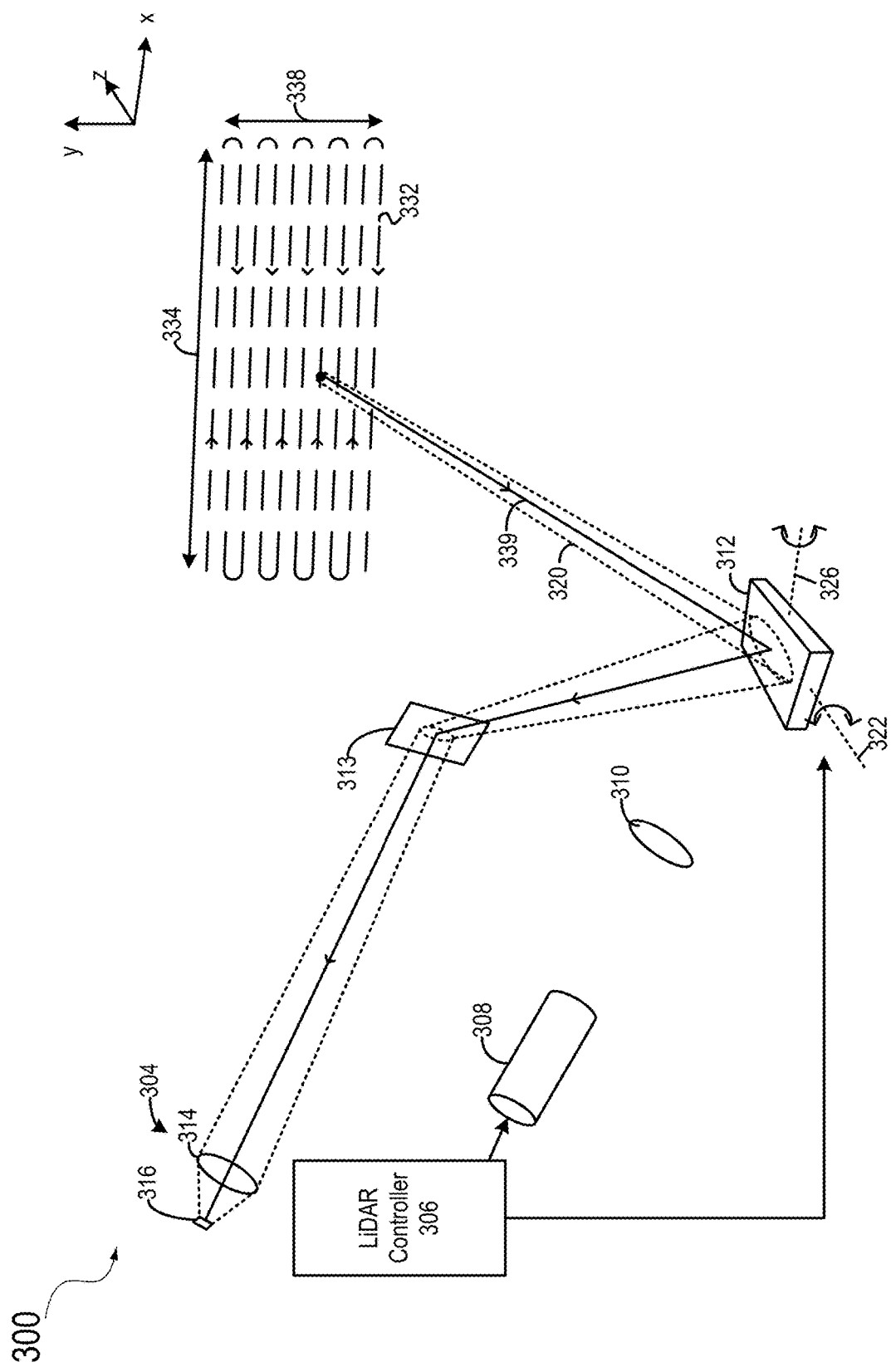

FIG. 3A and FIG. 3B illustrate a simplified block diagram of an example of a LiDAR module 300 according to certain embodiments. LiDAR module 300 may be an example of LiDAR system 102, and may include a transmitter 302, a receiver 304, and a LiDAR controller 306 that controls the operations of transmitter 302 and receiver 304. Transmitter 302 may include a light source 308 and a collimator lens 310. Receiver 304 may include a lens 314 and a photodetector 316. LiDAR module 300 may further include a mirror assembly 312 and a beam deflector 313. In some embodiments, transmitter 302 and receiver 304 may be configured to share mirror assembly 312 (e.g., using a beam splitter/combiner) to perform a light steering and detecting operation, with beam deflector 313 configured to reflect incident light reflected by mirror assembly 312 to receiver 304. In some embodiments, beam deflector 313 may also be shared by transmitter 302 and receiver 304 (e.g., via a beam splitter/combiner), where outgoing light from light source 308 and reflected by mirror assembly 312 may also be reflected by beam deflector 313, while the returned beam may be deflected by mirror assembly 312 and beam deflector 313 to lens 314 and photodetector 316.

FIG. 3A illustrates an example of a beam steering operation by LiDAR module 300. To project light, LiDAR controller 306 can control light source 308 to transmit a light beam 318 (e.g., light pulses, an FMCW light signal, an AMCW light signal, etc.). Light beam 318 may diverge upon leaving light source 308 and may be collimated by collimator lens 310. The collimated light beam 318 may propagate with substantially the same beam size.

The collimated light beam 318 may be incident upon mirror assembly 312, which can reflect and steer the light beam along an output projection path 319 towards a field of interest, such as object 112. Mirror assembly 312 may include one or more rotatable mirrors, such as a one-dimensional or two-dimensional array of micro-mirrors. Mirror assembly 312 may also include one or more actuators (not shown in FIG. 3A) to rotate the rotatable mirrors. The actuators may rotate the rotatable mirrors around a first axis 322, and/or may rotate the rotatable mirrors around a second axis 326. The rotation around first axis 322 may change a first angle 324 (e.g., longitude angle) of output projection path 319 with respect to a first dimension (e.g., the x-axis or z-axis). The rotation around second axis 326 may change a second angle 328 (e.g., altitude angle) of output projection path 319 with respect to a second dimension (e.g., the y-axis). LiDAR controller 306 may control the actuators to produce different combinations of angles of rotation around first axis 322 and second axis 326 such that the movement of output projection path 319 can follow a scanning pattern 332. A range 334 of movement of output projection path 319 along the x-axis, as well as a range 338 of movement of output projection path 319 along the y-axis, can define a FOV. An object within the FOV, such as object 112, can receive and scatter the collimated light beam 318 to form returned light signals, which can be received by receiver 304.

FIG. 3B illustrates an example of a returned beam detection operation by LiDAR module 300. LiDAR controller 306 can select an incident light direction 339 for detection of incident light by receiver 304. The selection can be based on setting the angles of rotation of the rotatable mirrors of mirror assembly 312, such that only light beam 320 propagating along incident light direction 339 is reflected to beam deflector 313, which can then divert light beam 320 to photodetector 316 via lens 314. Photodetector 316 may include any suitable high-speed detector that can detect light pulses in the working wavelength of the LiDAR system, such as a PIN photodiode, a silicon photomultiplier (SiPM) sensor, or an avalanche photodetector. With such arrangements, receiver 304 can selectively receive signals that are relevant for the ranging/imaging of a target object, such as light pulse 110 generated by the reflection of the collimated light beam by object 112, and not to receive other signals. As a result, the effect of environment disturbance on the ranging/imaging of the object can be reduced, and the system performance can be improved.

Figure 4:
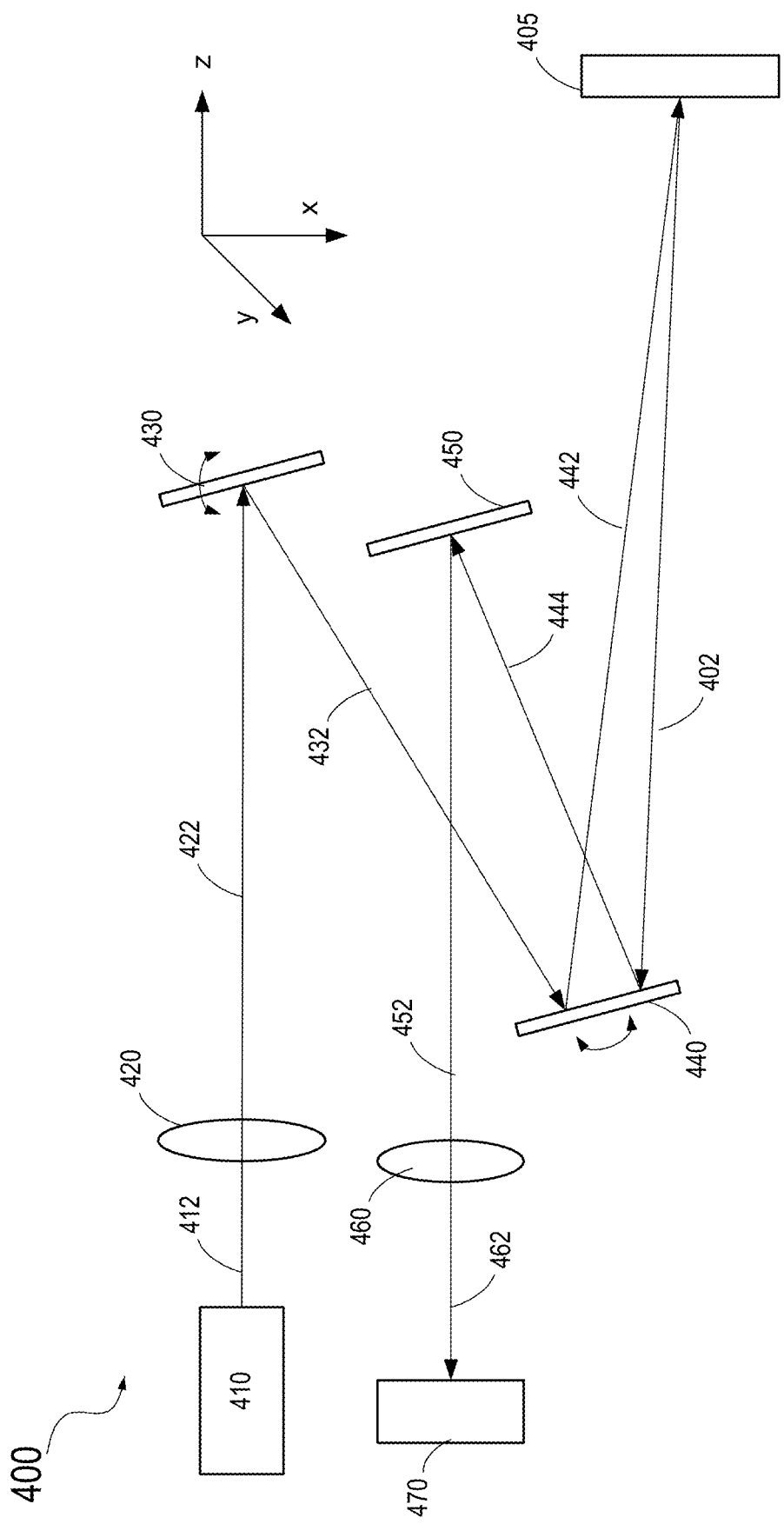
FIG. 4 is a simplified diagram of an example of an optical subsystem in a LiDAR system according to certain embodiments.

FIG. 4 is a simplified block diagram of an example of an optical subsystem 400 in a LiDAR system, such as LiDAR system 102 shown in FIG. 1, according to certain embodiments. In some embodiments, a plurality of optical subsystems 400 can be integrated into the LiDAR system to achieve, for example, 360° coverage in the transverse plane. In one example, a LiDAR system may include eight optical subsystems 400 distributed around a circle, where each optical subsystem 400 may have a field of view about 45° in the transverse plane.

In the example shown in FIG. 4, optical subsystem 400 may include a light source 410, such as a laser (e.g., a pulsed laser diode). A light beam 412 emitted by light source 410 may be collimated by a collimation lens 420. The collimated light beam 422 may be incident on a first deflector 430, which may be stationary or may rotate in at least one dimension such that collimated light beam 422 may at least be deflected by first deflector 430 towards, for example, different y locations. Collimated light beam 432 deflected by first deflector 430 may be further deflected by a second deflector 440, which may be stationary or may rotate in at least one dimension. For example, second deflector 440 may rotate and deflect collimated light beam 432 towards different x locations. Collimated light beam 442 deflected by second deflector 440 may reach a target point at a desired (x, y) location on a target object 405. As such, first deflector 430 and second deflector 440 may, alone or in combination, scan the collimated light beam in two dimensions to different (x, y) locations in a far field.

Target object 405 may reflect collimated light beam 442 by specular reflection or scattering. At least a portion of the reflected light 402 may reach second deflector 440 and may be deflected by second deflector 440 as a light beam 444 towards a third deflector 450. Third deflector 450 may deflect light beam 444 as a light beam 452 towards a receiver, which may include a lens 460 and a photodetector 470. Lens 460 may focus light beam 452 as a light beam 462 onto a location on photodetector 470, which may include a single photodetector or an array of photodetectors. Photodetector 470 may be any suitable high-speed detector that can detect light pulses in the working wavelength of the LiDAR system, such as a PIN photodiode, an SiPM sensor, or an avalanche photodetector. In some embodiments, one or more other deflectors may be used in the optical path to change the propagation direction of the light beam (e.g., fold the light beam) such that the size of optical subsystem 400 may be reduced or minimized without impacting the performance of the LiDAR system. For example, in some embodiments, a fourth deflector may be placed between third deflector 450 and lens 460, such that lens 460 and photodetector 470 may be placed in desired locations in optical subsystem 400.

The light deflectors described above may be implemented using, for example, a micro-mirror array, a Galvo mirror, a stationary mirror, a grating, or the like. In one example, first deflector 430 may include a micro-mirror array, second deflector 440 may include a Galvo mirror, and third deflector 450 and other deflectors may include stationary mirrors. A micro-mirror array can have an array of micro-mirror assemblies, with each micro-mirror assembly having a rotatable micro-mirror and an actuator (or multiple actuators). The micro-mirrors and actuators can be formed as a MEMS on a semiconductor substrate, which may allow the integration of the MEMS with other circuitries (e.g., controller, interface circuits, etc.) on the semiconductor substrate.

In some MEMS micro-mirrors, a rotatable mirror may be supported by, for example, one or more torsional beams or springs which may in turn be anchored to a substrate. In some embodiments, the rotatable mirror may be supported by an accompanying gimbal that may in turn be supported by one or more torsional beams or springs. The rotatable mirror and/or the gimbal may be rotated around an actual or virtual pivot or connection point (e.g., the torsional beams or a rotational axis) by an actuator, such as a micro-motor, an electromagnetic actuator, an electrostatic actuator, an acoustic actuator, or a piezoelectric actuator including a piezoelectric material, such as quartz or lead zirconate titanate (PZT) ceramic. Some MEMS micro-mirrors may not include torsional beams or springs, where a micro-mirror may be attached to two or more actuators that may be anchored to the substrate and hold the micro-mirror in place.

FIG. 5A illustrates an example of a rotatable micro-mirror assembly 500 according to certain embodiments. Rotatable micro-mirror assembly 500 may be a micro-mirror element in an array of micro-mirror elements fabricated on a wafer. Rotatable micro-mirror assembly 500 may include a substrate 510, a micro-mirror 520, and a frame 530 (referred to as a gimbal or a gimbal frame). In some implementations, frame 530 may not be used, and micro-mirror 520 may be directly connected to substrate 510. Substrate 510 may include a semiconductor substrate, such as a silicon wafer. In some implementations, a silicon oxide or silicon nitride layer may be formed on the silicon wafer. In some implementations, electrodes and other circuits and/or structures may be formed on substrate 510. For example, piezoelectric actuators, electromagnetic actuators, electrostatic actuators, or other electrically controllable actuators may be formed on substrate 510. Some examples of actuators are described in more detail with respect to other figures below.

Frame 530 may be etched or otherwise formed on substrate 510, and may include a ring having a desired shape, such as a rectangular, circular, or oval shape. Micro-mirror 520 may also be etched or otherwise formed on substrate 510. Micro-mirror 520 may have a rectangular, circular, or oval shape and may include a highly reflective surface. Frame 530 and micro-mirror 520 may form a gimbal structure. For example, two or more connectors 550 may connect micro-mirror 520 to frame 530, while two or more connectors 540 may connect frame 530 (and micro-mirror 520) to substrate 510. Connectors 550 and 540 may be torsional structures formed (e.g., etched) on substrate 510, and may be elastic and deformable. The torsional structures can be in the form of, for example, a torsional beam, bar, spring, and the like. The torsional structures may have a certain stiffness, and may provide the restoring force for returning micro-mirror 520 and/or frame 530 to their original positions. Connectors 550 and 540 may also function as pivotal points or pivotal connections, around which frame 530 and micro-mirror 520 may rotate. For example, a pair of connectors 550 may form a pivot/axis of rotation of micro-mirror 520 around the y-axis within frame 530. Alternatively or additionally, a pair of connectors 550 may form a pivot/axis of rotation of micro-mirror 520 around the x-axis within frame 530. When both pairs of connectors are used, one of the two pairs of connectors may include flexible connectors. A pair of connectors 540 may function as a pivot/axis of rotation of frame 530 and micro-mirror 520 around the y-axis with respect to substrate 510.

Rotatable micro-mirror assembly 500 may be used to deflect an incident light beam, such as a collimated infrared laser beam, to a desired direction in a two-dimensional or three-dimensional space. For example, micro-mirror 520 may be rotated by a desired angle around the x and/or y axis to direct the incident light to a desired direction. Micro-mirror 520 may be continuously rotated or may be rotated in a number of steps to perform a two-dimensional or three-dimensional scan. The range of the rotation angles of micro-mirror 520 may define the field of view of micro-mirror 520.

FIG. 5B includes a cross-sectional view (e.g., along a line A-A) of the example of rotatable micro-mirror assembly 500 shown in FIG. 5A according to certain embodiments. In the example shown in FIG. 5B, frame 530 may be rotated by an angle $\theta_1$ around the y-axis (e.g., an axis formed by a pair of connectors 540) within substrate 510 and with respect to substrate 510, while micro-mirror 520 may be rotated by an angle $\theta_2$ around the y-axis (e.g., an axis formed by a pair of connectors 550) within frame 530 and with respect to substrate 510.

The rotation angle (e.g., $\theta_1$ or $\theta_2$) may depend on the torque $\tau$ applied to frame 530 or micro-mirror 520 and the stiffness K of connectors 540 or 550 according to:

$$\tau = -K\theta.$$

The stiffness K of the connectors may be affected by several factors, such as the material of the connectors, the cross-sectional area of the connectors, the shape of the connectors, and the like. In one example, the stiffness K can be determined according to:

$$K = \frac{k_2 \times G \times w^3 \times H}{L},$$

where L is the length of a connector, G is the shear modulus of the material that forms the connector, and $k_2$ is a factor that depends on the ratio between the thickness (H) and the width (w) of the connector.

Different rotation angles of the micro-mirror may be achieved by applying different torques to frame 530 or micro-mirror 520 by an actuator. When the torque from the actuator is removed or reduced, the torsional force caused by the distortion (e.g., bend or twist) and the elasticity of the connectors may return micro-mirror 520 or frame 530 back to its default position. Micro-mirror 520 or frame 530 may be driven again to start another rotation. The rotations of micro-mirror 520 or frame 530 may be in the form of an oscillation. In a steady state, micro-mirror 520 may rotate at a resonant frequency ω that may depend on the stiffness K of the connectors and the moment of inertia J of micro-mirror 520 according to:

$$\omega = \sqrt{\frac{K}{J}}.$$

The actuator may apply and then remove a torque at the resonant frequency of micro-mirror 520 to maintain the oscillation. For example, during the steady state, the actuator may apply a torque at the resonant frequency to overcome the damping of the oscillation caused by, for example, frictions or other sources that may cause the conversion of kinetic energy to thermal energy.

In some rotatable micro-mirror assemblies, the micro-mirrors may be actuated by electrostatic actuators. For example, an electrostatic actuator may include a moving part and a stationary part (e.g., fixed to the substrate or another anchor) that can be charged such that the attractive or repulsive Coulomb force between the charges on the moving part and the stationary part may cause relative movements of the moving part with respect to the stationary part.

FIG. 6A illustrates an example of a rotatable micro-mirror assembly 600 including electrostatic actuators. Rotatable micro-mirror assembly 600 may be an example of rotatable micro-mirror assembly 500, and may include a substrate 610, a frame 620, and a micro-mirror 630. As frame 530 and micro-mirror 520, frame 620 and micro-mirror 630 may form a gimbal structure. Frame 620 may be connected to substrate 610 by two or more connectors 615 (e.g., torsional beams), while micro-mirror 630 may be connected to frame 620 by two or more connectors 625 (e.g., torsional beams). As described above, connectors 615 and 625 may be elastic and deformable. One end of each connector 615 may be physically attached to substrate 610 and thus may be fixed, while the other end of each connector 615 may be movable due to the deformation of connector 615 caused by electrostatic forces.

In the illustrated example, the electrostatic actuators may include a first set of fingers 612 formed on substrate 610, and a second set of fingers 622 on frame 620. First set of fingers 612 and second set of fingers 622 may be interleaved to increase the total interface area and thus the electrostatic force between them. First set of fingers 612 are affixed onto substrate 610 and thus are stationary with respect to substrate 610. Second set of fingers 622 may be movable with respect to first set of fingers 612 due to, for example, attractive or repulsive Coulomb forces between charges on surfaces of first set of fingers 612 and second set of fingers 622. Thus, frame 620 may rotate with second set of fingers 622 around an axis 640 formed by a pair of connectors 615. The rotation of frame 620 may cause the rotation of micro-mirror 630 due to the connections between frame 620 and micro-mirror 630 by connectors 625.

The electrostatic force between first set of fingers 612 and second set of fingers 622 may depend on the overlapping areas between first set of fingers 612 and second set of fingers 622, the gaps between the side surfaces of a finger 612 and an adjacent finger 622, and the voltages or charges on first set of fingers 612 and second set of fingers 622. For example, the electrostatic force F between first set of fingers 612 and second set of fingers 622 may be determined by:

$$F = \frac{1}{2} \times \epsilon_0 \times \epsilon_r \times \frac{L}{d} \times V^2,$$

where $\epsilon_0$ is permittivity of free space, $\epsilon_r$ is the relative permittivity of a dielectric material between the fingers (if any, which may be 1 when there is no such dielectric material as shown in FIG. 5A), L is the length of the overlapping area between the fingers, d is the gap between a pair of adjacent fingers, and V is the voltage difference between the two sets of fingers. The electrostatic force F may generate a torque to rotate frame 620 and/or micro-mirror 630 around axis 640 such that the reflecting surface of micro-mirror 630 may be at a desired angle (e.g., a certain roll angle) with respect to the x-y plane.

FIG. 6B includes a cross-sectional view (e.g., along a line A-A) of the example of rotatable micro-mirror assembly 600 shown in FIG. 6A. In the illustrated example, frame 620 may be rotated by an angle around an axis (e.g., formed by a pair of connectors 615) with respect to substrate 610, and micro-mirror 630 may be rotated by an angle around an axis (e.g., formed by a pair of connectors 625) within frame 620 and with respect to substrate 610.

As shown in FIG. 6B, when the second set of fingers 622 rotates with respect to first set of fingers 612, the overlapped area between the two sets of fingers may change. The two sets of fingers may exert electrostatic forces on each other when the fingers are engaged, such as when there is an overlap between the side surfaces (e.g., in a y-z plane) of the fingers or when the fingers are close enough. When frame 620 and/or micro-mirror 630 rotate by a large angle, there may not be any overlap between the side surfaces the two sets of fingers. Therefore, second set of fingers 622 may become disengaged from first set of fingers 612, and there may be no or only a minimum electrostatic force between first set of fingers 612 and second set of fingers 622. As such, in the electrostatic actuator shown in FIGS. 6A and 6B, the displacement between first set of fingers 612 and the second set of fingers 622, which may be approximately proportional to the size of frame 620 and the rotation angle, may be limited in order to keep the fingers engaged. Therefore, the rotation angle of micro-mirror 630 may be limited as well.

In addition, as described above, the resonant frequency of rotatable micro-mirror assembly 600 may depend on the moment of inertia of frame 620 and/or micro-mirror 630. Second set of fingers 622 can contribute significantly to the overall moment of inertia of frame 620 and micro-mirror 630 because the fingers are positioned at the periphery of frame 620 and thus may have the largest distance r to the pivot point, and because the moment of inertia may be proportional to $r^2$. Therefore, the resonant frequency may be reduced due to the larger overall moment of inertia of frame 620 and micro-mirror 630.

As the sizes of frame 620 and micro-mirror 630 become larger (and thus heavier) in order to transmit more light for a longer detection range, the moment of inertia of frame 620 and micro-mirror 630 may be larger. The displacement of second set of fingers 622 with respect to first set of fingers 612 may also become larger for any rotation angle. Therefore, some electrostatic actuators may not provide enough force or torque to start and maintain the mirror oscillations, and may not achieve a large rotation angle (because of the finger disengagement at a large displacement) and a high resonant frequency (due to a large moment of inertia).

According to certain embodiments, piezoelectric actuators may be used in rotatable micro-mirror assemblies to achieve the large displacements and large rotation angles. The piezoelectric actuators may physically connect the micro-mirrors and/or frames to fixation points and thus may not have the disengagement issue associated with electrostatic actuators. In addition, the piezoelectric actuators can be used as torsional structures such that additional torsional structures (e.g., connectors 540 or 615) may or may not be used. The piezoelectric actuators can be designed to provide a large displacement and have a sufficiently high stiffness.

Figure 7A:
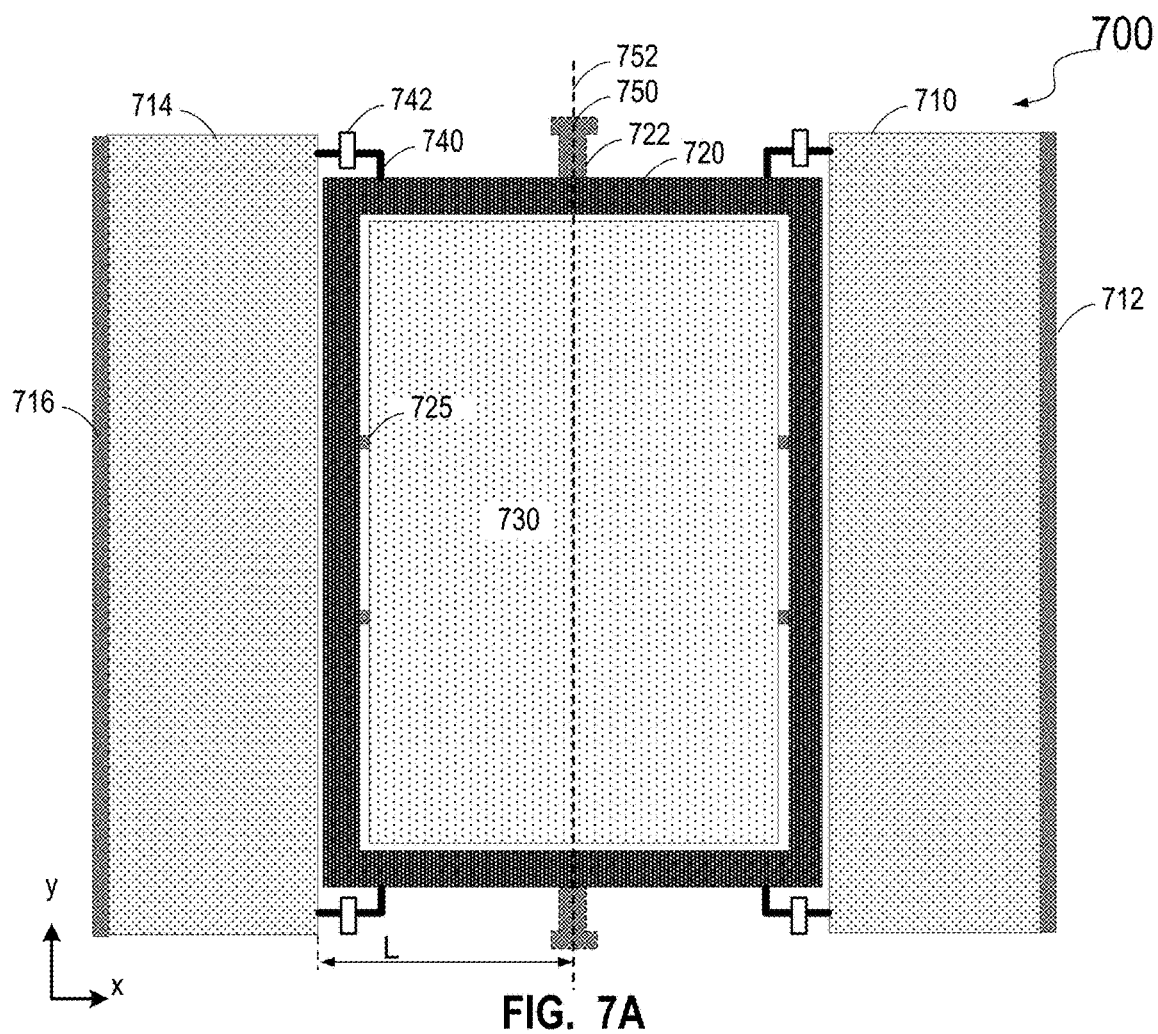
FIG. 7A illustrates an example of a rotatable micro-mirror assembly including piezoelectric actuators according to certain embodiments.

FIG. 7A illustrates an example of a rotatable micro-mirror assembly 700 including piezoelectric actuators 710 and 714 according to certain embodiments. Rotatable micro-mirror assembly 700 may be an example of rotatable micro-mirror assembly 500, and may include a gimbal frame 720 and a micro-mirror 730. Piezoelectric actuators 710 and 714 may each be fixed to an anchor 712 or 716, which may be a substrate or may be formed on a substrate. Piezoelectric actuators 710 and 714 may each be connected to gimbal frame 720 through one or more connection springs 740. In some embodiments, each connection spring 740 may include a structure 742 that may be deformed to extend when the displacement is large and the tension force is large.

In some embodiments, gimbal frame 720 may be connected to a pair of anchors 750 through torsion beams 722.

Anchors 750 may be pivotal points around which gimbal frame 720 may rotate. In some embodiments, anchors 750 and torsional beams 722 may not be used and gimbal frame 720 may rotate round an axis 752 due to the symmetrical structure of piezoelectric actuators 710 and 714 on opposite sides. Micro-mirror 730 may be connected to gimbal frame 720 through two or more connectors 725, such as torsional beams or springs.

Piezoelectric actuators 710 and 714 may each be controlled by an electrical signal (e.g., an AC signal, such as a square wave or a sinusoidal wave) to bend upward or downward, such that the movable ends of piezoelectric actuators 710 and 714 may oscillate up and down. During operations of rotatable micro-mirror assembly 700, piezoelectric actuators 710 and 714 may be controlled by electrical signals to bend in opposite directions, such as +z and −z directions. Piezoelectric actuators 710 and 714, when bended, may pull gimbal frame 720 from opposite sides and in opposite directions through connection springs 740, and thus may rotate gimbal frame 720 and micro-mirror 730 around axis 752.

Figure 7B:
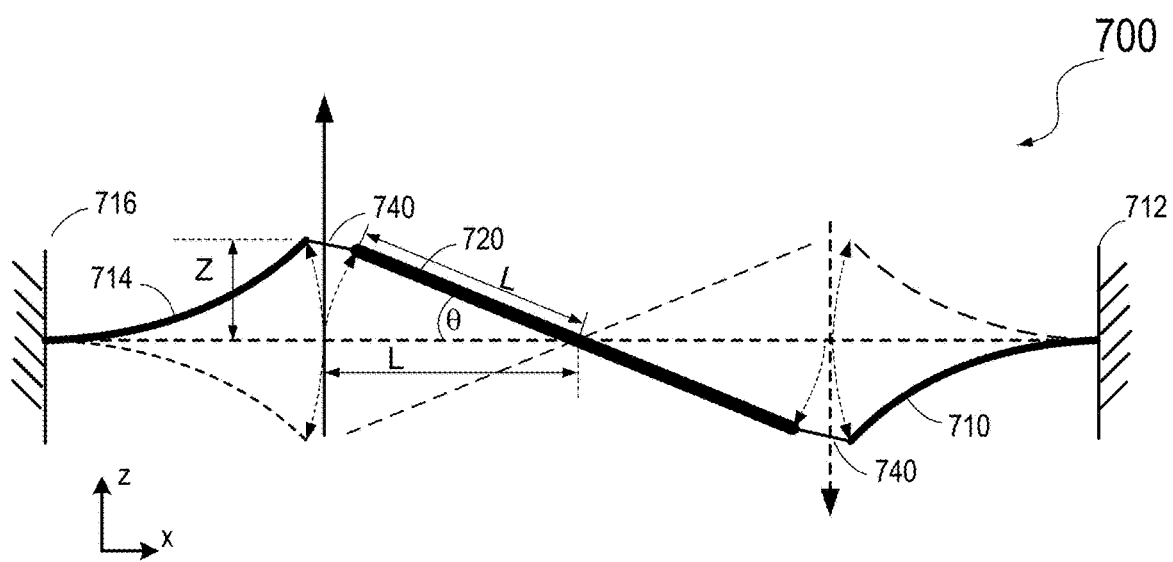
FIG. 7B illustrates an example of an operating condition of the example of the rotatable micro-mirror assembly shown in FIG. 7A.

FIG. 7B illustrates an example of an operating condition of the example of rotatable micro-mirror assembly 700 shown in FIG. 7A. In the illustrated example, piezoelectric actuator 710 may bend downward, while piezoelectric actuator 714 may bend upward. For example, the movable end of piezoelectric actuator 714 may have a vertical displacement Z, whereas the movable end of piezoelectric actuator 710 may have a vertical displacement −Z. Thus, one side of gimbal frame 720 may be pulled up and an opposite side of gimbal frame 720 may be pulled down to rotate gimbal frame 720 clockwisely by an angle θ, which may cause micro-mirror 730 to rotate as well due to the connectors 725 between gimbal frame 720 and micro-mirror 730. Because the piezoelectric actuators are bended and gimbal frame 720 are rotated, the distance between gimbal frame 720 and each piezoelectric actuator may be increased as shown in FIG. 7B. Connection springs 740, more specifically, structures 742, may be deformed to extend, such that gimbal frame 720 is still connected to piezoelectric actuators 710 and 714 through connection springs 740.

In some embodiments, at a given time, one of piezoelectric actuators 710 and 714 may be driven by a control signal, while the other one of piezoelectric actuators 710 and 714 may not be driven by a control signal. When driven by the control signals, piezoelectric actuators 710 and 714 may bend in the same direction. For example, during a first half period of an oscillation period, only piezoelectric actuator 714 may be driven by a control signal to bend upward, thereby causing micro-mirror 730 to rotate, for example, clockwisely; during the second half period of the oscillation period, only piezoelectric actuator 710 may be driven by a control signal to bend upward, thereby causing micro-mirror 730 to rotate counter-clockwisely.

Figure 8:
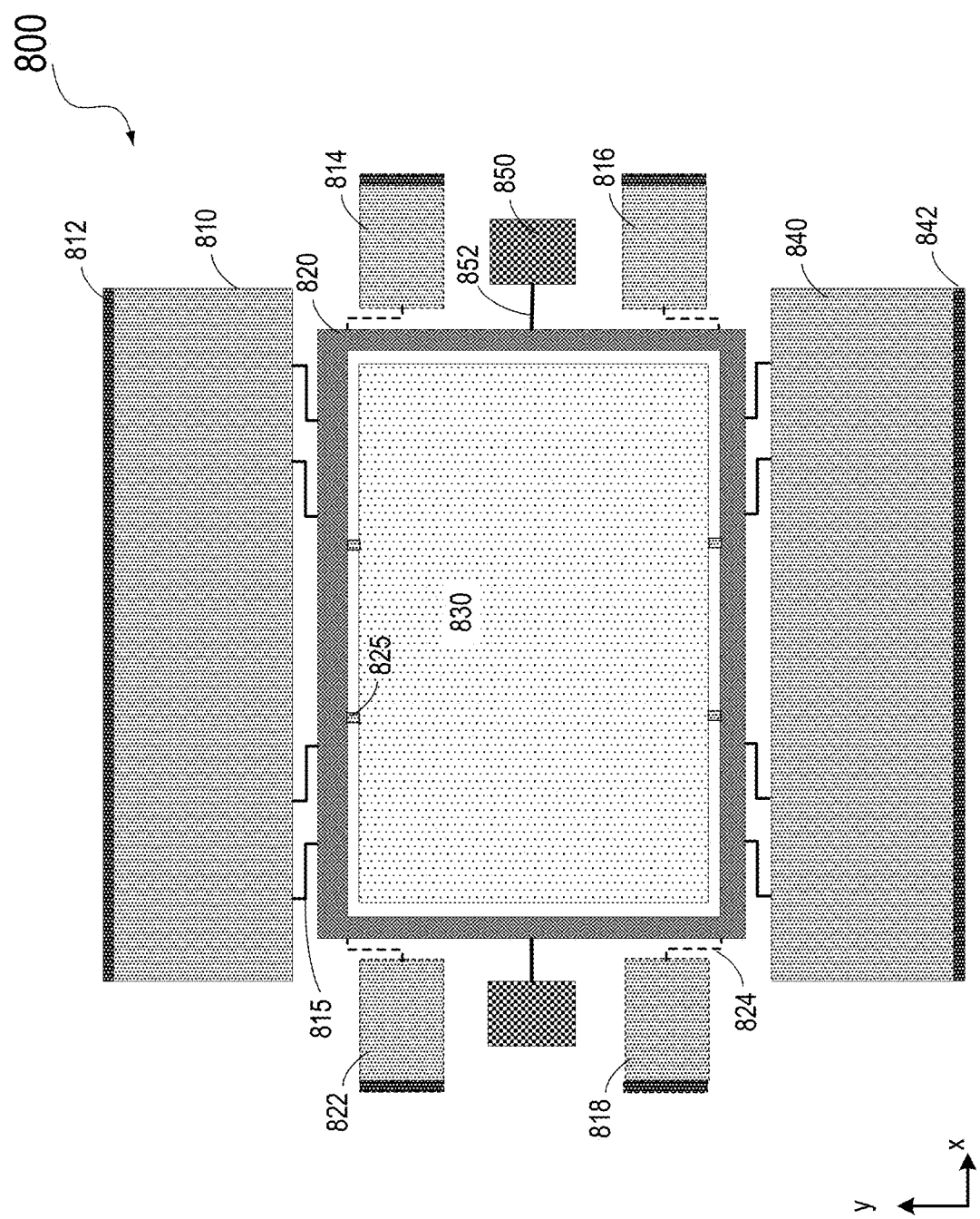
FIG. 8 illustrates another example of a rotatable micro-mirror assembly including piezoelectric actuators according to certain embodiments.

FIG. 8 illustrates another example of a rotatable micro-mirror assembly 800 including piezoelectric actuators according to certain embodiments. Rotatable micro-mirror assembly 800 may be another example of rotatable micro-mirror assembly 500. As rotatable micro-mirror assembly 700, rotatable micro-mirror assembly 800 may include a pair of piezoelectric actuators 810 and 840, which may be attached to anchors 812 and 842, respectively. A gimbal frame 820 may be connected to piezoelectric actuators 810 and 840 by a set of connection springs 815, such as two or more connection springs 815, four or more connection springs 815, six or more connection springs 815, or eight or more connection springs 815. In some embodiments, gimbal frame 820 may also be connected to a pair of anchors 850 by a pair of torsional beam 852. A micro-mirror 830 may be connected to gimbal frame 820 by a set of elastic connectors 825. In some embodiments, alternative or additional piezoelectric actuators 814, 816, 818, and/or 822 and connection springs 824 may be used to rotate gimbal frame 820 and micro-mirror 830.

As in rotatable micro-mirror assembly 700, piezoelectric actuators 810 and 840 may each be controlled by an electrical signal (e.g., an AC signal) to bend upward or downward, such that the movable ends of piezoelectric actuators 810 and 840 may oscillate up and down. During operations of rotatable micro-mirror assembly 800, piezoelectric actuators 810 and 840 may be controlled by electrical signals to bend in opposite directions. Piezoelectric actuators 810 and 840, when bended, may pull gimbal frame 820 from opposite sides and in opposite directions through connection springs 815, and thus may rotate gimbal frame 820 and micro-mirror 830 around anchors 850.

Piezoelectric actuators 814, 816, 818, and 822, when present, may work together with piezoelectric actuators 810 and 840 to provide a larger torque. For example, piezoelectric actuators 814 and 822 may be synchronized with piezoelectric actuator 810 such that they may oscillate (bend) in the same direction and at about the same phase with piezoelectric actuator 810 to increase the force and torque applied to gimbal frame 820. Similarly, piezoelectric actuators 816 and 818 may be synchronized with piezoelectric actuator 840 such that they may oscillate (bend) in the same direction and at about the same phase with piezoelectric actuator 840 to increase the force and torque applied to gimbal frame 820.

In rotatable micro-mirror assemblies 700 and 800, the force (or torque) applied to the gimbal frame (and the micro-mirror) may include a force (or torque) applied by the torsional beams (e.g., torsional beams 722 or torsional beams 852) and a force (or torque) applied by the piezoelectric actuators. A piezoelectric actuator may generally include a bimorph including an elastic layer and a piezoelectric layer that is between a top electrode and a bottom electrode. The force F provided by the piezoelectric actuator may be determined according to:

$$F = F_0 - K_A z,$$

where $F_0$ is the blocking force to maintain the displacement of the movable end of the piezoelectric actuator at zero, $K_A$ is the bending stiffness of the piezoelectric actuator, and z is the displacement of the movable end of the piezoelectric actuator.

Thus, the total torque T applied to the gimbal frame and/or the micro-mirror at a rotation angle θ may be:

$$T = K_t \theta - FL = K_t \theta - L(F_0 - K_A z),$$

where $K_t$ is the torsional stiffness of the torsional beams (e.g., torsional beams 722 or torsional beams 852), and L is the distance between the movable end of the piezoelectric actuator and the rotational axis (e.g., axis 752) as shown in, for example, FIGS. 7A and 7B. When θ is small, z is approximately Lθ, and thus the total torque T may be determined according to:

$$T = (K_t + K_A L^2)\theta - F_0 L.$$

As such, the overall stiffness of the piezoelectric actuator and the torsional beam may be:

$$K = K_t + K_A L^2,$$

which indicates that the overall stiffness may include the torsional stiffness $K_t$ of the torsional beam and $L^2$ times of the bending stiffness $K_A$ of the piezoelectric actuator.

To increase the field of view, large rotation angles of the micro-mirror may be needed, which may correspond to large displacements and large torques. Eliminating the torsional beams may reduce the overall stiffness and thus the torque needed to rotate the micro-mirror. However, as described above, to achieve a high resolution, a device with a high resonant frequency may be desired. Thus, it is also desirable that the overall stiffness of the device is sufficiently high such that the resonant frequency can be sufficient high. To achieve a high displacement, the bending stiffness of the piezoelectric actuator may need to be low, which may correspond to a lower resonant frequency and a lower resolution. Piezoelectric actuators that can both achieve a large displacement and have a high stiffness may be desired.

FIG. 9A illustrates a simplified example of a piezoelectric actuator 900. Piezoelectric actuator 900 may be a conventional piezoelectric actuator. Piezoelectric actuator 900 may have a bimorph structure that includes an elastic layer 920 and a piezoelectric layer 910. Elastic layer 920 and/or piezoelectric layer 910 may be attached to an anchor 930, which may be, for example, a substrate or a structure formed on a substrate. Elastic layer 920 may include, for example, polysilicon, silicon nitride, silicon oxide, and the like. Piezoelectric layer 910 may include a layer of a piezoelectric material, such as quartz, lithium niobate, gallium arsenide, zinc oxide, aluminum nitride, or PZT ceramic, between two electrode layers. When a voltage signal is applied across the two electrode layers, piezoelectric layer 910 may expand or contract according to the direction and strength of the electric field applied to piezoelectric layer 910, while elastic layer 920 may not. The expansion or contraction of piezoelectric layer 910 may cause elastic layer 920 that is attached to piezoelectric layer 910 to bend downward or upward. Piezoelectric layer 910 with PZT may be able to apply high forces on elastic layer 920 at low driving voltages. In addition, a piezoelectric actuator-based micro-mirror assembly may be less affected by air damping, thermal interferences, or electromagnetic or magnetic interferences than devices based on electrostatic, thermal, or electromagnetic actuators.

FIG. 9B illustrates an example of a layer stack-up of piezoelectric actuator 900. In the illustrated example, elastic layer 920 may include one or more layers. For example, elastic layer 920 may include a silicon oxide layer 926, a silicon nitride layer 924, and another silicon oxide layer 922. In some embodiments, elastic layer 920 may include a single layer of, for example, polysilicon or silicon nitride. Piezoelectric layer 910 may include a bottom electrode layer 916, which may include, for example, Ti/TiO$_2$/Pt. A piezoelectric material layer 914, such as a layer of quartz, lithium niobate, gallium arsenide, zinc oxide, aluminum nitride, or PZT ceramic, may be formed on bottom electrode layer 916. A top electrode layer 912 may be formed on piezoelectric material layer 914. Top electrode layer 912 may include, for example, Pt. A control signal may be applied across piezoelectric material layer 914 through top electrode layer 912 and bottom electrode layer 916 to cause piezoelectric material layer 914 to expand or contract (depending on the polarity of the applied voltage or electric field), thereby bending elastic layer 920 attached to piezoelectric layer 910 downward or upward.

Because piezoelectric layer 910 is directly on top of elastic layer 920, the force arm (the distance between the point of force and the pivot point) or the moment arm (the perpendicular distance between the line of action of the force and the pivot point) of piezoelectric layer 910 for bending elastic layer 920 may be relatively small. Therefore, the bending of piezoelectric actuator 900 (or the displacement of a movable end 902) may be small.

According to certain embodiments, an improved piezoelectric actuator may include an elastic layer and a piezoelectric layer adjacent to the elastic layer to bend the elastic layer, where the elastic layer may include a solid sublayer and a sublayer with cavities between the solid sublayer and the piezoelectric layer. The sublayer with cavities may increase the distance between of the piezoelectric layer and the solid sublayer of the elastic layer, thereby increasing the force arm and the bending moment of the piezoelectric layer on the solid sublayer of the elastic layer. Therefore, the displacement of the movable end of the elastic layer can be increased. As a result, a large scanning angle and field of view may be achieved by a micro-mirror driven by the piezoelectric actuator. The sublayer with cavities can also help to increase the overall stiffness of the piezoelectric actuator, thereby increasing the resonant frequency of the piezoelectric actuator and the beam scanning resolution of the micro-mirror driven by the piezoelectric actuator. In one example, the elastic layer may be battlement-shaped, and the piezoelectric layer may be partially suspended, where the portion of the elastic layer that supports the piezoelectric layer may act as the force arm for bending the solid sublayer of the elastic layer.

Figures 10A, 10B, 10C:
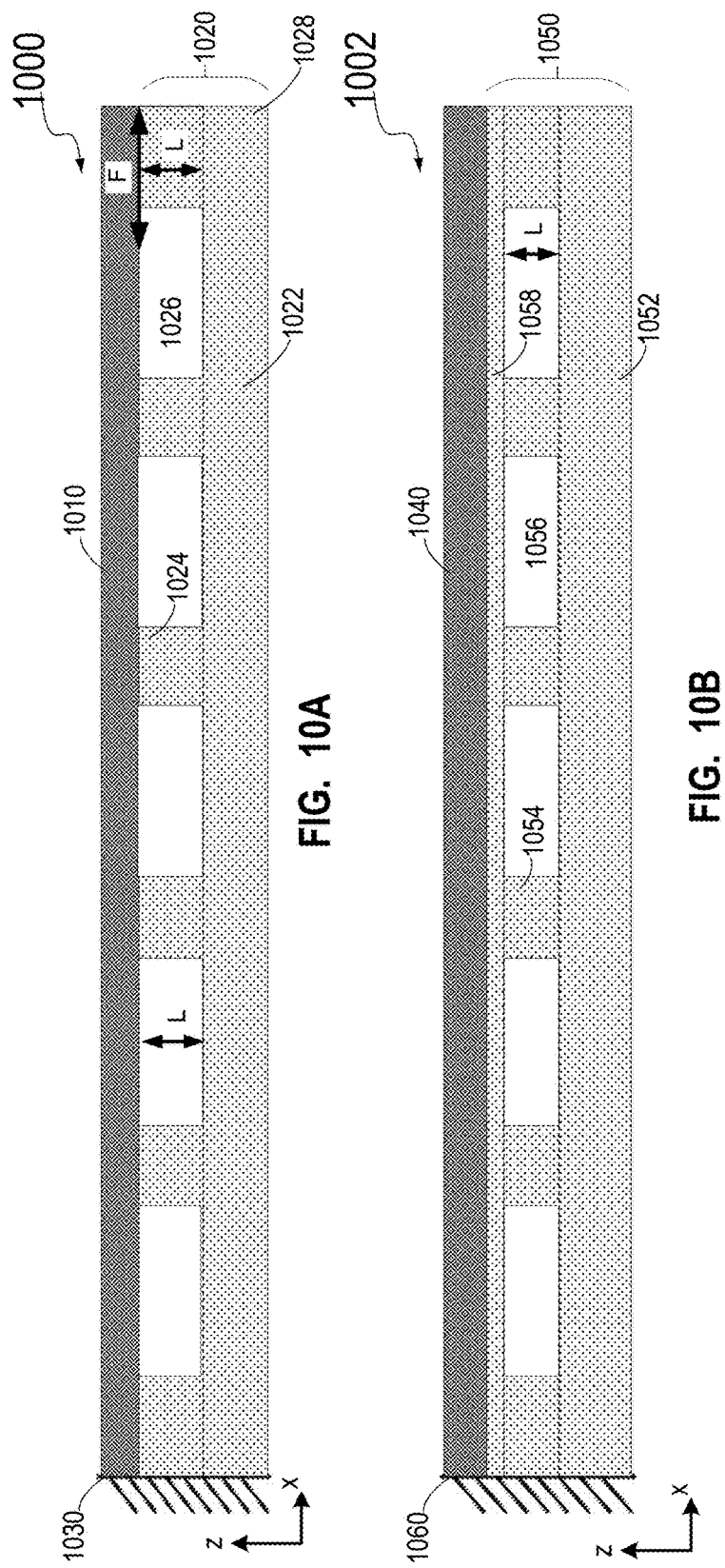
FIG. 10A illustrates an example of a piezoelectric actuator according to certain embodiments.
FIG. 10B illustrates another example of a piezoelectric actuator according to certain embodiments.
FIG. 10C illustrates yet another example of a piezoelectric actuator according to certain embodiments.

FIG. 10A illustrates an example of a piezoelectric actuator 1000 according to certain embodiments. Piezoelectric actuator 1000 may include an elastic layer 1020 and a piezoelectric layer 1010 adjacent to elastic layer 1020. Elastic layer 1020 and piezoelectric layer 1010 may be attached to an anchor 1030, which may be, for example, a bulk material, such as a substrate for an array of micro-mirrors or a structure formed on the substrate. As described above with respect to FIG. 9B, piezoelectric layer 1010 may include a layer of a piezoelectric material, such as quartz, lithium niobate, gallium arsenide, zinc oxide, aluminum nitride, or PZT ceramic, between two electrode layers. In one example, the piezoelectric material may be the PZT ceramic. Elastic layer 1020 may include a solid sublayer 1022 that includes an elastic material, such as polysilicon or silicon nitride. Elastic layer 1020 may also include a sublayer 1024 with cavities 1026. Sublayer 1024 may be between solid sublayer 1022 and piezoelectric layer 1010. Sublayer 1024 can include an elastic material or an inelastic material. Cavities 1026 may have a height L, which may be larger than a threshold value, such as 5 μm, 10 μm, 20 μm, or larger. In some embodiments, height L may be equal to or greater than, for example, a third or a half of a thickness of solid sublayer 1022. Cavities 1026 may be formed by, for example, photolithography and dry/wet etching techniques. Cavities 1026 may include a one-dimensional array of cavities or a two-dimensional array of cavities.

When a voltage signal is applied to the two electrode layers, the electric field in the piezoelectric material layer may cause the PZT material to expand or contract according to the direction and the intensity of the electric field in the piezoelectric material layer. The expansion or contraction of the PZT material may apply a force F to elastic layer 1020 as illustrated in FIG. 10A. The direction of the force may depend on whether the PZT material expands or contracts. For example, when the PZT material expands, force F applied by piezoelectric layer 1010 to elastic layer 1020 may be in the +x direction, and force F applied to solid sublayer 1022 may have a moment arm with a length ≥L with respect to a pivot point (e.g., anchor 1030). Thus, force F may apply a torque to solid sublayer 1022 to bend solid sublayer 1022 clockwisely around the pivot point. When the PZT material contracts, force F applied by piezoelectric layer 1010 to elastic layer 1020 may be in the −x direction with a moment arm having a length L, and thus force F may bend solid sublayer 1022 counter-clockwisely. In general, the larger the height and width of cavities 1026, the larger the displacement of a movable end 1028 of elastic layer 1020.

FIG. 10B illustrates another example of a piezoelectric actuator 1002 according to certain embodiments. As piezoelectric actuator 1000, piezoelectric actuator 1002 may include an elastic layer 1050 and a piezoelectric layer 1040 adjacent to elastic layer 1050. Elastic layer 1050 and piezoelectric layer 1040 may be attached to an anchor 1060, which may be, for example, a bulk material, such as a substrate or a structure on the substrate. As described above, piezoelectric layer 1040 may include, for example, a PZT material layer between two electrode layers. Elastic layer 1050 may include a solid sublayer 1052 that includes an elastic material, such as polysilicon or silicon nitride. Elastic layer 1050 may also include a sublayer 1054 with cavities 1056. As sublayer 1024, sublayer 1054 may help to increase the force arm or moment arm of the force applied by piezoelectric layer 1040 to solid sublayer 1052 of elastic layer 1050. Sublayer 1054 may include an elastic material or an inelastic material. Elastic layer 1050 may further include a solid support sublayer 1058 under piezoelectric layer 1040. Solid support sublayer 1058 may provide a better contact and coupling between elastic layer 1050 and piezoelectric layer 1040 for piezoelectric layer 1040 to apply forces to elastic layer 1050. Cavities 1056 may have a height L. Cavities 1056 may be formed by, for example, photolithography, dry/wet etching, and deposition or growth techniques. Cavities 1056 may include a one-dimensional array of cavities or a two-dimensional array of cavities. In general, the larger the height and width of cavities 1056, the larger the displacement of the movable end of elastic layer 1050.

FIG. 10C illustrates yet another example of a piezoelectric actuator 1004 according to certain embodiments. Piezoelectric actuator 1004 may include a top piezoelectric layer 1070, a bottom piezoelectric layer 1072, and an elastic layer 1080 between top piezoelectric layer 1070 and bottom piezoelectric layer 1072. Elastic layer 1080, and/or top piezoelectric layer 1070 and bottom piezoelectric layer 1072 may be attached to an anchor 1090 that is connected to or on a substrate. Piezoelectric layers 1070 and 1072 may each include, for example, a PZT material layer between two electrode layers as described above. Elastic layer 1080 may include a solid sublayer 1082 that includes an elastic material, such as polysilicon or silicon nitride. Elastic layer 1080 may also include a sublayer 1084 with cavities 1086. As sublayer 1024, sublayer 1084 may help to increase the force arm or moment arm of the force applied by top piezoelectric layer 1070 to solid sublayer 1082 of elastic layer 1080. Elastic layer 1080 may also include a sublayer 1088 with cavities 1092. As sublayer 1024, sublayer 1088 may help to increase the force arm or moment arm of the force applied by bottom piezoelectric layer 1072 to solid sublayer 1082 of elastic layer 1080. Sublayers 1084 and 1088 may include an elastic material or an inelastic material. Cavities 1086 and 1092 may be formed by, for example, photolithography and dry/wet etching techniques. Cavities 1086 may include a one-dimensional array of cavities or a two-dimensional array of cavities. Cavities 1092 may also include a one-dimensional array of cavities or a two-dimensional array of cavities.

In piezoelectric actuator 1004, piezoelectric layers 1070 and 1072 may be driven by different voltage signals. For example, top piezoelectric layer 1070 may be driven by a first voltage signal that may cause the PZT material or another piezoelectric material in top piezoelectric layer 1070 to expand, while bottom piezoelectric layer 1072 may be driven by a second voltage signal that may cause the PZT material or another piezoelectric material in bottom piezoelectric layer 1072 to contract. Thus, both top piezoelectric layer 1070 and bottom piezoelectric layer 1072 may bend solid sublayer 1082 of elastic layer 1080 clockwisely or downward. In another example, top piezoelectric layer 1070 may be driven by a first voltage signal that may cause the PZT material or another piezoelectric material in top piezoelectric layer 1070 to contract, while bottom piezoelectric layer 1072 may be driven by a second voltage signal that may cause the PZT material or another piezoelectric material in bottom piezoelectric layer 1072 to expand. Thus, both top piezoelectric layer 1070 and bottom piezoelectric layer 1072 may bend solid sublayer 1082 of elastic layer 1080 counter-clockwisely or upward. Therefore, top piezoelectric layer 1070 and bottom piezoelectric layer 1072 may work together to apply a higher force and torque to elastic layer 1080, and may cause a larger displacement of the movable end of elastic layer 1080.

Figure 11B:
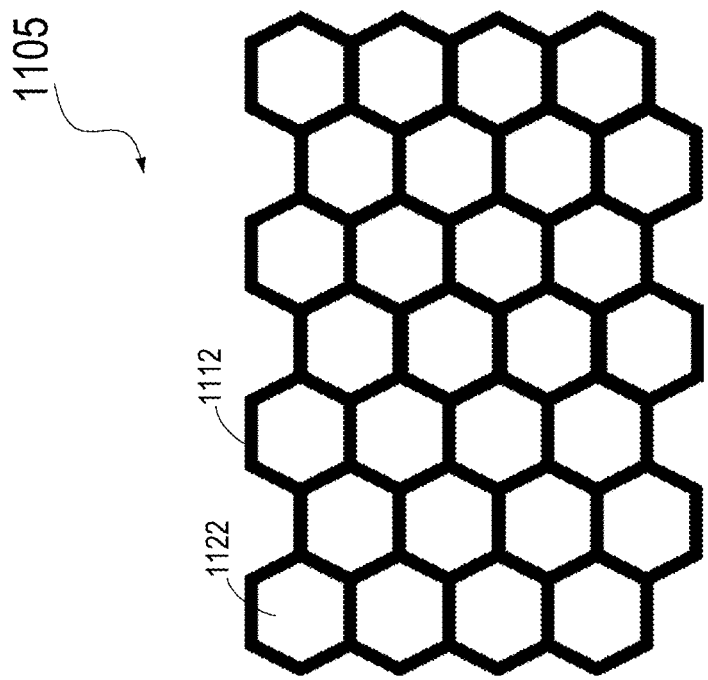
FIG. 11B is a top view of a cross-section of another example of an elastic layer in a piezoelectric actuator according to certain embodiments.
Figure 11A:
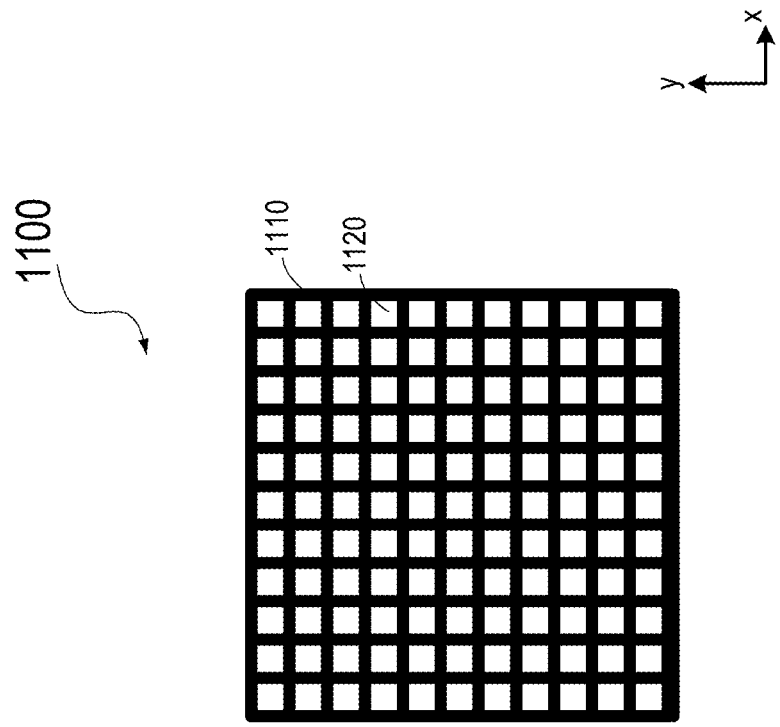
FIG. 11A is a top view of a cross-section of an example of an elastic layer in a piezoelectric actuator according to certain embodiments.

FIG. 11A is a top view of a cross-section 1100 of an example of an elastic layer in a piezoelectric actuator according to certain embodiments. Cross-section 1100 may be a cross-section of sublayer 1024, sublayer 1054, sublayer 1084, or sublayer 1088 described above. FIG. 11A shows an example arrangement of walls 1110 and cavities 1120 (e.g., cavities 1026, 1056, 1086, or 1092) in the sublayer of the elastic layer. In the illustrated example, walls 1110 and cavities 1120 are arranged to from a matrix or a mesh.

FIG. 11B is a top view of a cross-section 1105 of another example of an elastic layer in a piezoelectric actuator according to certain embodiments. Cross-section 1105 may be a cross-section of sublayer 1024, sublayer 1054, sublayer 1084, or sublayer 1088 described above. FIG. 11B shows an example arrangement of walls 1112 and cavities 1122 (e.g., cavities 1026, 1056, 1086, or 1092) in the sublayer of the elastic layer. In the illustrated example, walls 1112 and cavities 1122 are arranged to from a honeycomb pattern.

It is noted that the piezoelectric actuators shown in FIGS. 10A-11B are only a few examples of possible configurations of the piezoelectric actuators. In other embodiments, the piezoelectric actuators may have other configurations of the piezoelectric layer and the elastic layer, such as other stack arrangements or other cross-sectional patterns of the cavities and walls arrangements. For example, the cavities may each have a circular shape, an oval shape, a diamond shape, a polygonal shape, or the like.

Finite Element Analysis (FEA) simulations are performed for examples of piezoelectric actuator 900 and examples of piezoelectric actuator 1000. In the simulations, the length and width of the piezoelectric actuators are set to 3100 µm and 150 µm, respectively; the thickness of the piezoelectric material layer is about 2 µm; and the piezoelectric constant $e_{31,f}$ is about 13.7 C/m². These parameters and other parameters used for the simulations are summarized in Table 1 below.

TABLE 1

| FEA simulation parameters | |
|---|---|
| Length of beam (µm) | 3100 |
| Width of beam (µm) | 150 |
| Thickness of piezoelectric layer (µm) | 2 |
| $e_{31,f}$ (C/m²) | 13.7 |

TABLE 1-continued

FEA simulation parameters

| | |
|---|---|
| Voltage (V) | 10 |
| Lumped mass (kg) | 2.17e−8 |

Figure 12A:
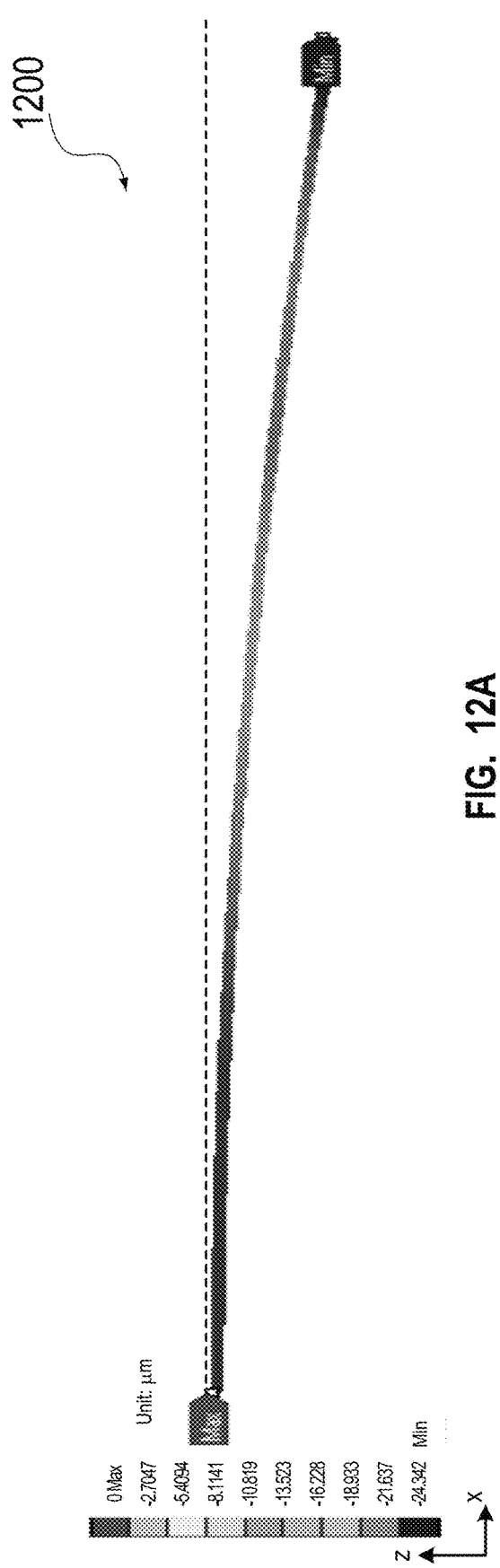
FIG. 12A illustrates simulated directional (e.g., vertical) displacements of an example of a piezoelectric actuator.
Figure 12B:
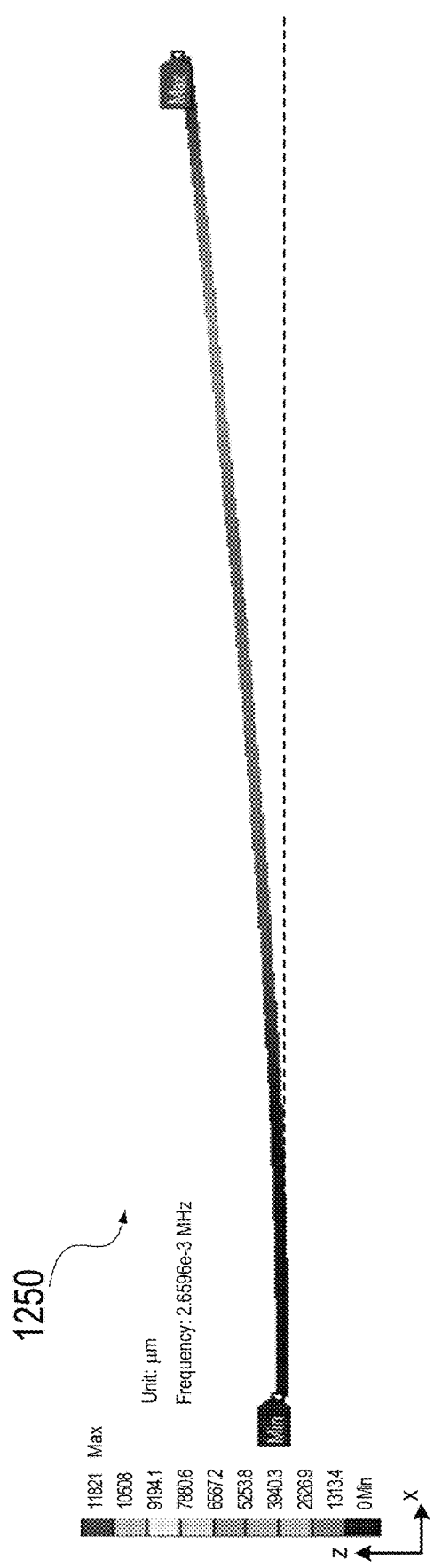
FIG. 12B illustrates simulated total displacements and the resonant frequency of an example of a piezoelectric actuator.

FIG. 12A includes a diagram 1200 illustrating simulated vertical displacements (or vertical deformations) of an example of piezoelectric actuator 900 using parameters listed in Table 1. FIG. 12B includes a diagram 1250 illustrating simulated total deformations (in μm) and the resonant frequency of the example of piezoelectric actuator 900. The thickness of elastic layer 920 used for the simulation is about 20 μm. Piezoelectric actuator 900 is modeled using a distributed mass model. The simulation results show that, when a 10-V signal is applied to piezoelectric layer 910, the maximum displacement of movable end 902 of piezoelectric actuator 900 is about 24.34 μm, and the resonant frequency of piezoelectric actuator 900 is about 2659.6 Hz.

Figure 13A:
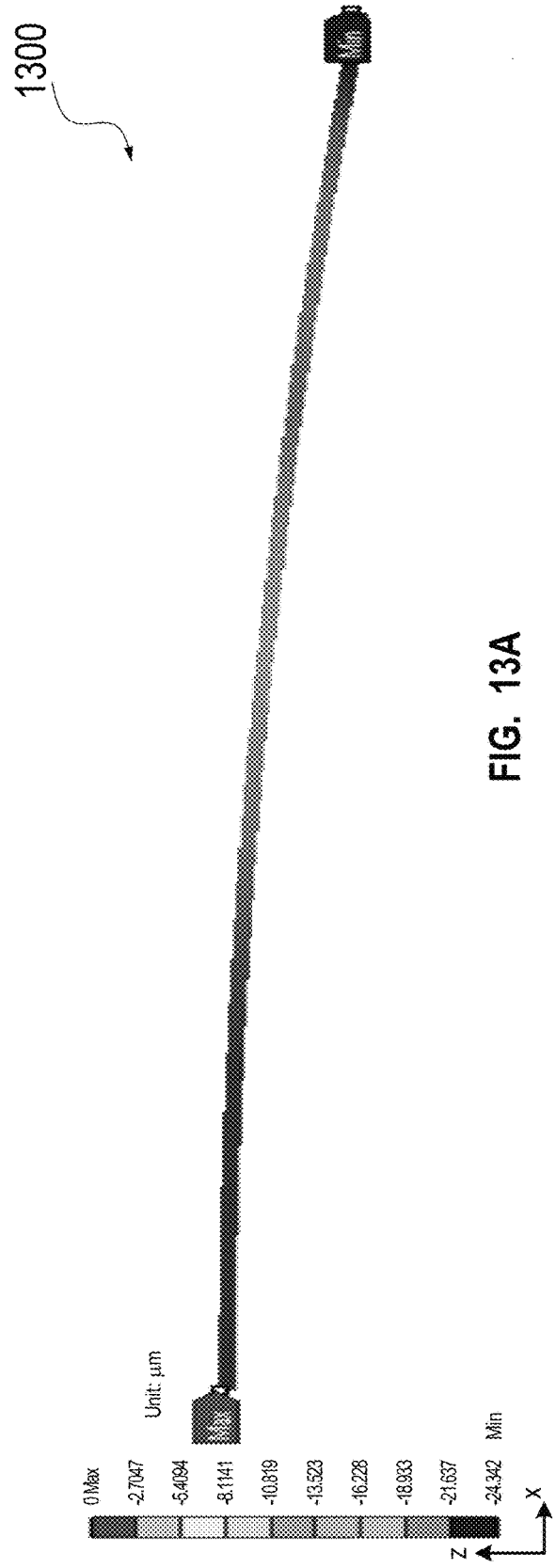
FIG. 13A illustrates simulated directional displacements of an example of a piezoelectric actuator.
Figure 13B:
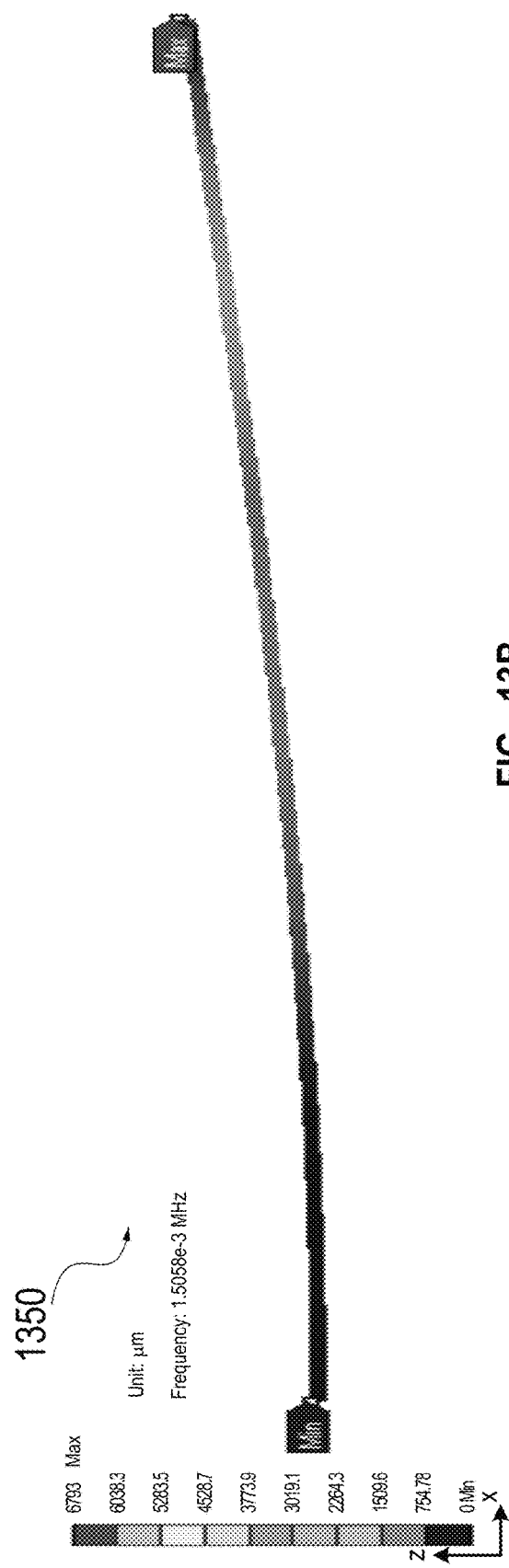
FIG. 13B illustrates simulated total displacements and the resonant frequency of an example of a piezoelectric actuator.

FIG. 13A includes a diagram 1300 illustrating simulated vertical displacements (or vertical deformations) of an example of piezoelectric actuator 900 using parameters listed in Table 1. FIG. 13B includes a diagram 1350 illustrating simulated total deformations (in μm) and the resonant frequency of the example of piezoelectric actuator 900. The thickness of elastic layer 920 used for the simulation is about 20 μm. Piezoelectric actuator 900 is modeled using a lumped mass model where the total mass (e.g., $2.17 \times 10^{-8}$ Kg for the simulation) is lumped at movable end 902 of piezoelectric actuator 900. The simulation results show that, when a 10-V signal is applied to piezoelectric layer 910, the maximum displacement of movable end 902 of piezoelectric actuator 900 is about 24.34 μm, and the resonant frequency of piezoelectric actuator 900 is about 1505.8 Hz.

Figure 14A:
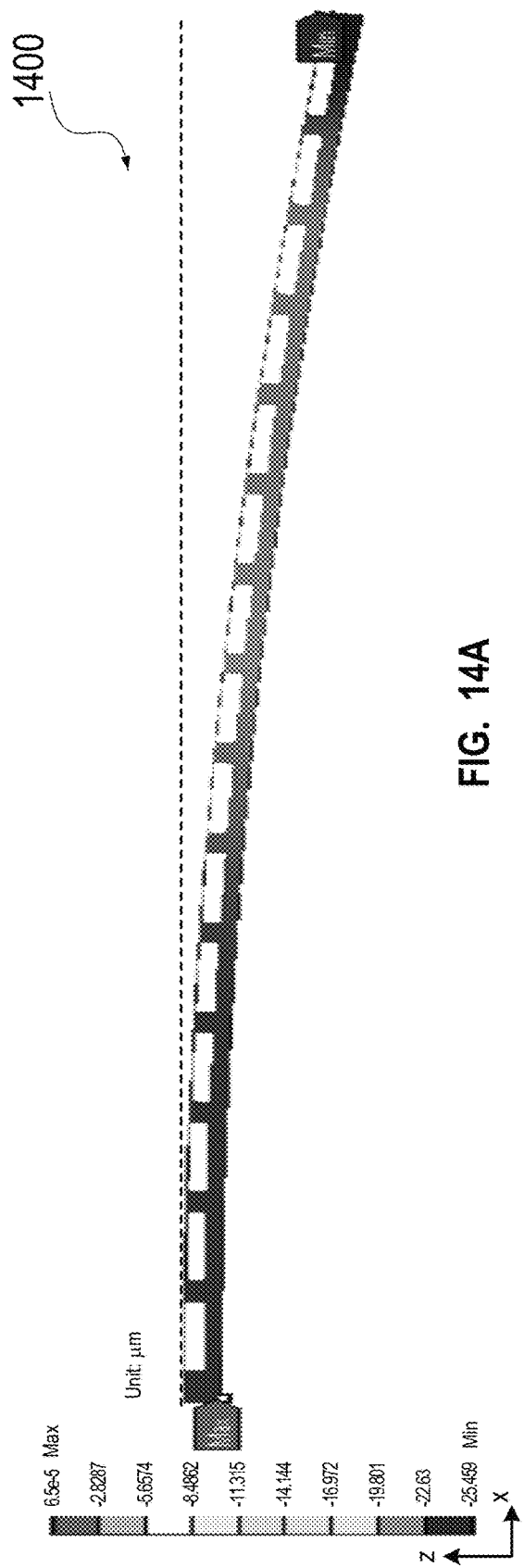
FIG. 14A illustrates simulated directional displacements of an example of a piezoelectric actuator according to certain embodiments.
Figure 14B:
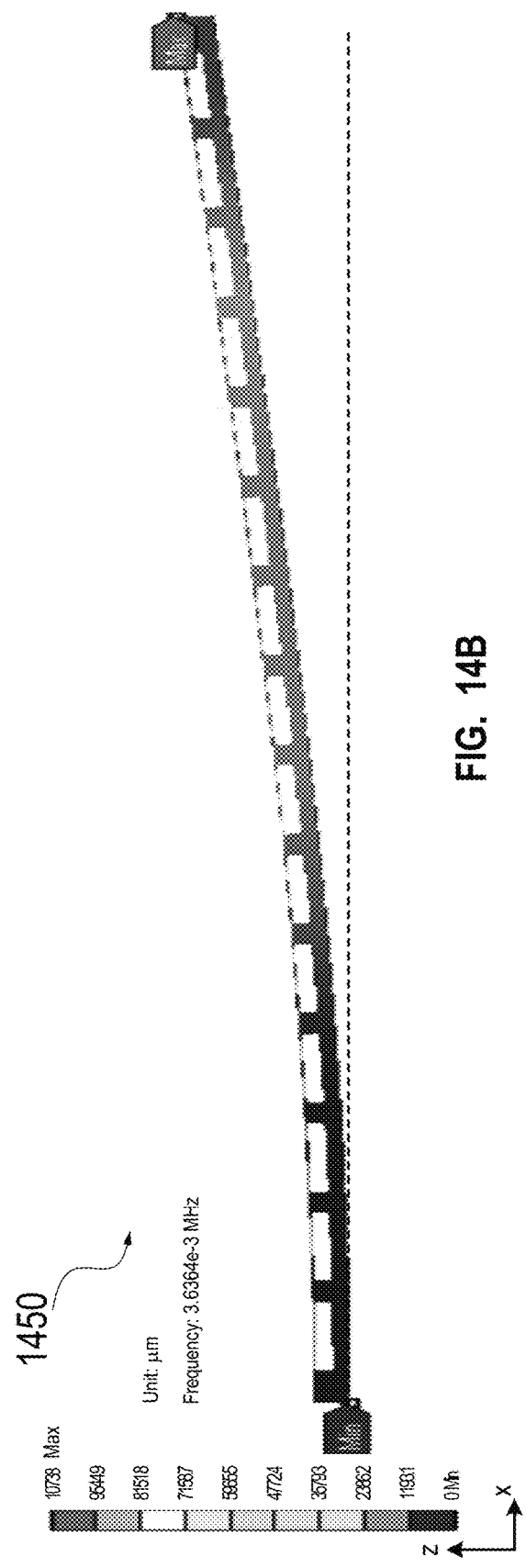
FIG. 14B illustrates simulated total displacements and the resonant frequency of an example of a piezoelectric actuator according to certain embodiments.

FIG. 14A includes a diagram 1400 illustrating simulated vertical displacements of an example of piezoelectric actuator 1000 using parameters listed in Table 1. FIG. 14B includes a diagram 1450 illustrating simulated total deformations (in μm) and the resonant frequency of the example of piezoelectric actuator 1000. The thickness of solid sublayer 1022 in elastic layer 1020 used in the simulation is about 20 μm. The height L of cavities 1026 used in the simulation is about 20 μm. Piezoelectric actuator 1000 is modeled using a distributed mass model. The simulation results show that, when a 10-V signal is applied to piezoelectric layer 1010, the maximum displacement of movable end 1028 of piezoelectric actuator 1000 is about 25.46 μm, and the resonant frequency of piezoelectric actuator 1000 is about 3636.4 Hz.

Figure 15A:
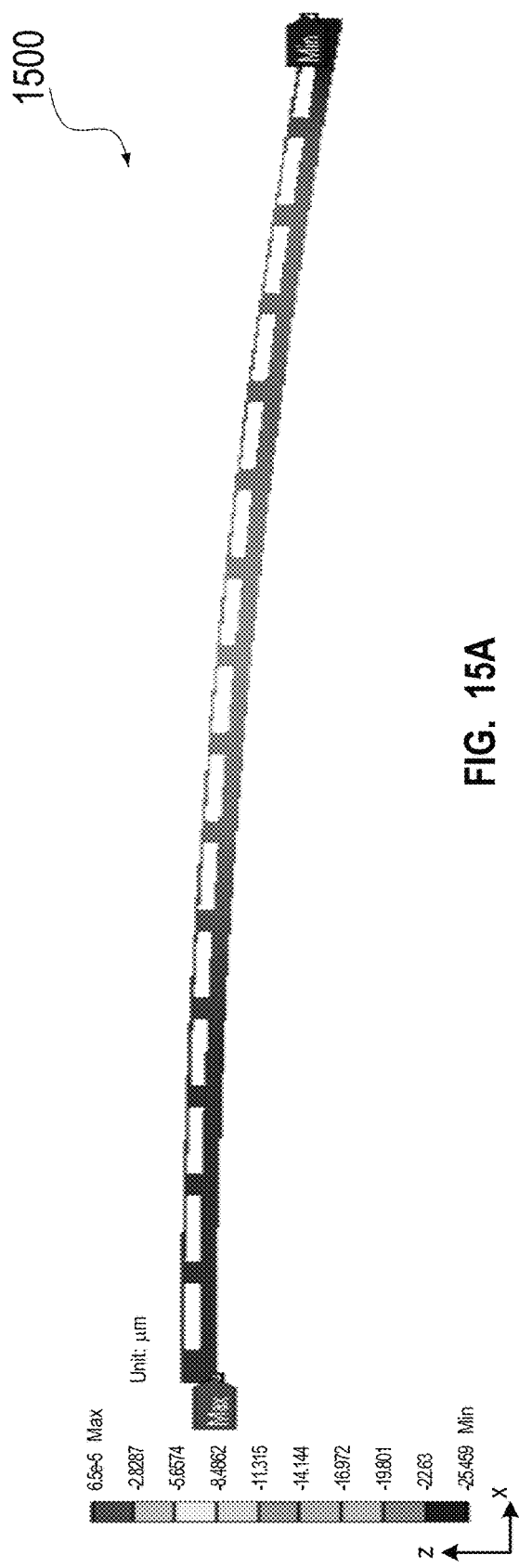
FIG. 15A illustrates simulated directional displacements of an example of a piezoelectric actuator according to certain embodiments.
Figure 15B:
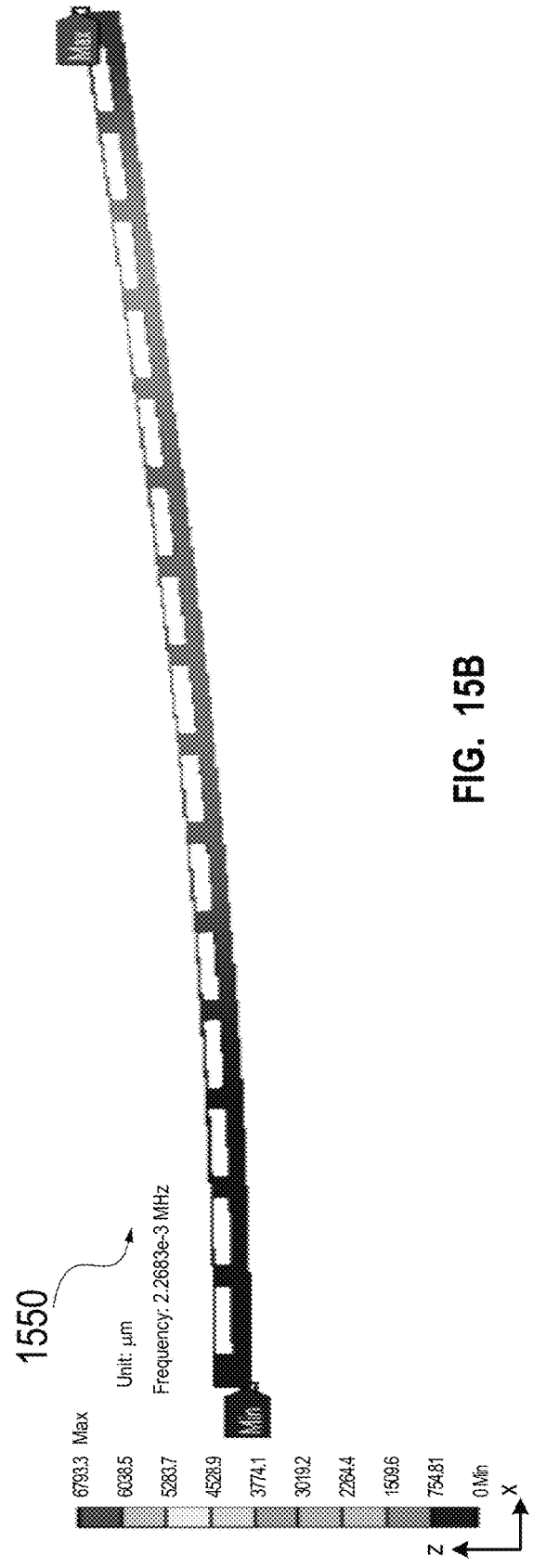
FIG. 15B illustrates simulated total displacements and the resonant frequency of an example of a piezoelectric actuator according to certain embodiments.

FIG. 15A includes a diagram 1500 illustrating simulated vertical displacements of an example of piezoelectric actuator 1000 using parameters listed in Table 1. FIG. 15B includes a diagram 1550 illustrating simulated total deformations and the resonant frequency of the example of piezoelectric actuator 1000. The thickness of solid sublayer 1022 in elastic layer 1020 used in the simulation is about 20 μm. The height L of cavities 1026 used in the simulation is about 20 μm. Piezoelectric actuator 1000 is modeled using a lumped mass model where the total mass (e.g., $2.17 \times 10^{-8}$ Kg for the simulation) is lumped at movable end 1028 of piezoelectric actuator 1000. The simulation results show that, when a 10-V signal is applied to piezoelectric layer 1010, the maximum displacement of movable end 1028 of piezoelectric actuator 1000 is about 25.46 μm, and the resonant frequency of piezoelectric actuator 1000 is about 2268.3 Hz.

FIG. 16A includes a diagram 1600 illustrating simulated vertical displacements of an example of piezoelectric actuator 1000 using parameters listed in Table 1. FIG. 16B includes a diagram 1650 illustrating simulated total deformations and the resonant frequency of the example of piezoelectric actuator 1000. The simulation is performed to tune the thickness of solid sublayer 1022 to achieve the same stiffness (determined based on the same or similar resonant frequency) in piezoelectric actuator 1000 as in piezoelectric actuator 900 shown in FIGS. 13A and 13B. The height L of cavities 1026 used in the simulation is about 20 μm. Piezoelectric actuator 1000 is modeled using a lumped mass model where the total mass (e.g., $2.17 \times 10^{-8}$ Kg for the simulation) is lumped at movable end 1028 of piezoelectric actuator 1000. The simulation results show that, when the thickness of solid sublayer 1022 of elastic layer 1020 is about 11 μm, piezoelectric actuator 1000 may have the same or similar resonant frequency (e.g., about 1525.7 Hz) as the resonant frequency of piezoelectric actuator 900 shown in FIG. 13B (e.g., about 1505.8 Hz). The simulation results also show that, when a 10-V signal is applied to piezoelectric layer 1010, the maximum displacement of movable end 1028 of piezoelectric actuator 1000 is about 46.26 μm. As such, piezoelectric actuator 1000 may achieve a much higher displacement, while maintaining a high stiffness (similar to the stiffness of a conventional piezoelectric actuator with similar parameters).

Simulation results shown in FIG. 12A-16B are summarized in Table 2 below. The simulation results show that the piezoelectric actuator structures disclosed herein can achieve a much higher displacement than a conventional piezoelectric actuator that has a similar stiffness or resonant frequency. For example, a piezoelectric actuator according to techniques disclosed herein can achieve a directional (e.g., vertical) displacement about 46.26 μm and a resonant frequency about 1525 Hz, whereas a conventional piezoelectric actuator having a similar physical size and resonant frequency (e.g., about 1505.8 Hz) may only achieve a vertical displacement about 24.34 μm. The simulation results show that a piezoelectric actuator according to techniques disclosed herein can achieve a much higher resonant frequency than a conventional piezoelectric actuator having a similar or lower vertical displacement.

TABLE 2

Summary of simulation results

| Actuator structure | Gap (μm) | Elastic layer thickness (μm) | Displacement (μm) | Bending resonant frequency (Hz) | Mass |
|---|---|---|---|---|---|
| Traditional | 0 | 20 | 24.34 | 2659.6 | Distributed |
| Proposed | 20 | 20 | 25.46 | 3636.4 | Distributed |
| Traditional | 0 | 20 | 24.34 | 1505.8 | Lumped |
| Proposed | 20 | 20 | 25.46 | 2268.3 | Lumped |
| Proposed | 20 | 11 | 46.26 | 1525.7 | Lumped |

Figure 17:
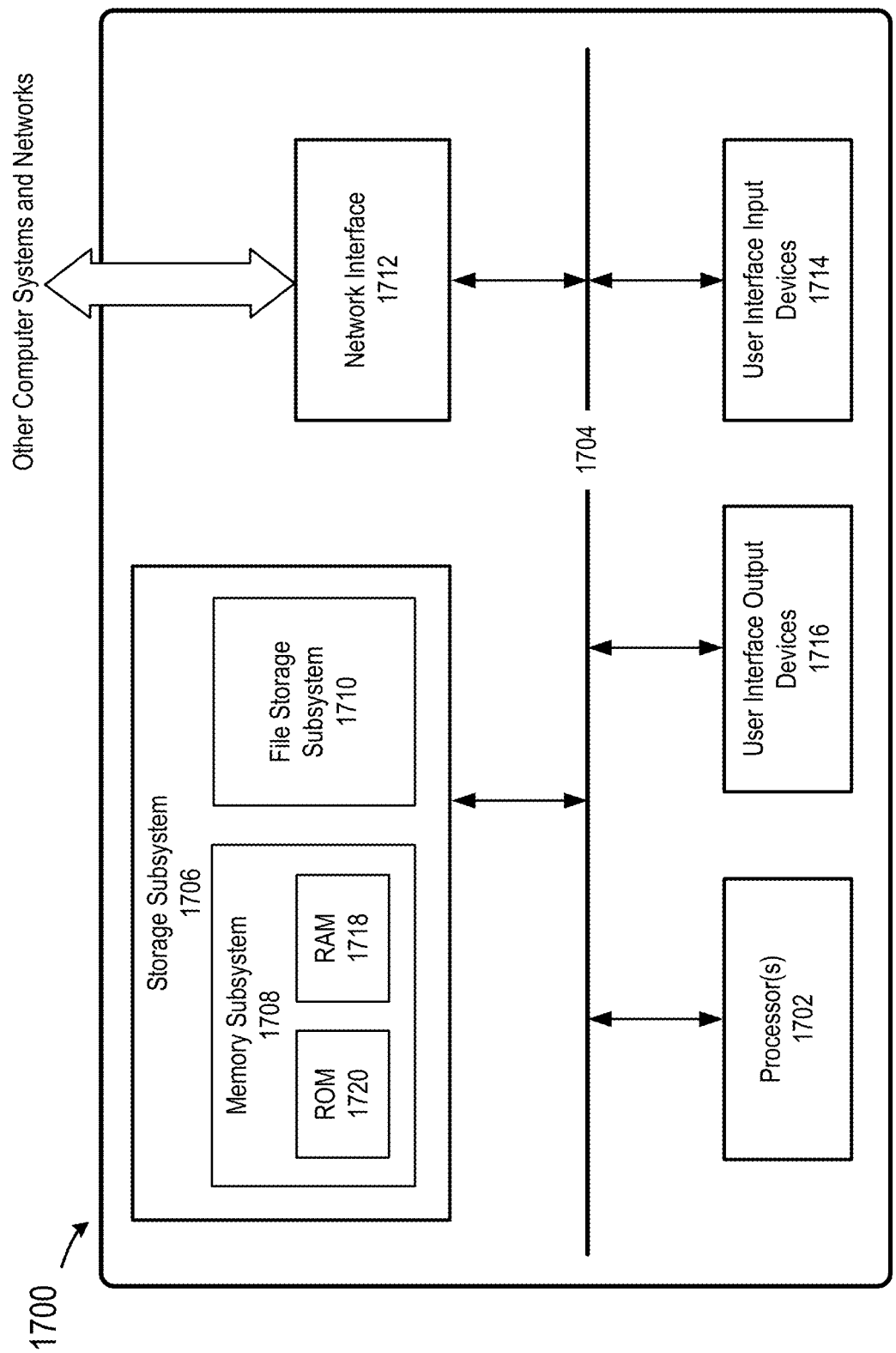
FIG. 17 is a simplified block diagram of an example of a computer system for implementing some techniques disclosed herein according to certain embodiments.

FIG. 17 illustrates an example of a computer system 1700 for implementing some of the embodiments disclosed herein. Computer system 1700 can be used to implement any of the LiDAR systems discussed above. For example, computer system 1700 may be used to implement LiDAR system 102, processor/controller 210, LiDAR controller 306, or other systems, subsystems, units, or components described herein. Computer system 1700 can include one or more processors 1702 that can communicate with a number of peripheral devices (e.g., input devices) via an internal bus subsystem 1704. These peripheral devices can include storage subsystem 1706 (comprising memory subsystem 1708 and file storage subsystem 1710), user interface input devices 1714, user interface output devices 1716, and a network interface subsystem 1712.

In some examples, internal bus subsystem 1704 can provide a mechanism for letting the various components and subsystems of computer system 1700 communicate with each other as intended. Although internal bus subsystem 1704 is shown schematically as a single bus, alternative embodiments of the bus subsystem can utilize multiple buses. Additionally, network interface subsystem 1712 can serve as an interface for communicating data between computer system 1700 and other computer systems or networks. Embodiments of network interface subsystem 1712 can include wired interfaces (e.g., Ethernet, CAN, RS-232, RS-485, etc.) or wireless interfaces (e.g., ZigBee, Wi-Fi, cellular, etc.).

In some cases, user interface input devices 1714 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computer system 1700. Additionally, user interface output devices 1716 can include a display subsystem, a printer, or non-visual displays such as audio output devices, etc. The display subsystem can be any known type of display device. In general, use of the term "output device" is intended to include all possible types of devices and mechanisms for outputting information from computer system 1700.

Storage subsystem 1706 can include memory subsystem 1708 and file storage subsystem 1710. Subsystems 1708 and 1710 represent non-transitory computer-readable storage media that can store program code and/or data that provide the functionality of disclosed herein. In some embodiments, memory subsystem 1708 can include a number of memories including main random access memory (RAM) 1718 for storage of instructions and data during program execution and read-only memory (ROM) 1720 in which fixed instructions may be stored. File storage subsystem 1710 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 1700 is illustrative and not intended to limit embodiments of the present disclosure. Many other configurations having more or fewer components than computer system 1700 are possible. The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard or non-standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server as the operation server or the security server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. F or example, customized hardware might also be used and/or particular elements might be implemented in hardware, software (including portable software, such as applets) or both. Further, connections to other computing devices such as network input/output devices may be employed.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A micro-mirror assembly comprising:
a substrate;
a first piezoelectric actuator coupled to the substrate;
a second piezoelectric actuator coupled to the substrate; and
a micro-mirror positioned between the first piezoelectric actuator and the second piezoelectric actuator, the micro-mirror including:
a first edge coupled to the first piezoelectric actuator; and
a second edge opposing the first edge and coupled to the second piezoelectric actuator,
wherein each of the first piezoelectric actuator and the second piezoelectric actuator comprises:
an elastic layer comprising:
a solid sublayer including an elastic material; and
a second sublayer including a plurality of cavities; and
a piezoelectric layer on the second sublayer of the elastic layer, wherein each of the plurality of cavities is characterized by a height greater than a threshold value or greater than a half of a thickness of the solid sublayer of the elastic layer.

2. The micro-mirror assembly of claim 1, wherein the plurality of cavities includes a one-dimensional array or a two-dimensional array of cavities.

3. The micro-mirror assembly of claim 1, wherein the piezoelectric layer comprises:
   a top electrode;
   a bottom electrode; and
   a piezoelectric material layer between the top electrode and the bottom electrode.

4. The micro-mirror assembly of claim 1, wherein the piezoelectric layer is in physical contact with the second sublayer of the elastic layer.

5. The micro-mirror assembly of claim 1, wherein:
   the elastic layer further comprises a top sublayer on the second sublayer; and
   the piezoelectric layer is in physical contact with the top sublayer of the elastic layer.

6. The micro-mirror assembly of claim 1, wherein:
   the elastic layer further comprises a third sublayer including a second plurality of cavities;
   the solid sublayer is between the second sublayer and the third sublayer; and
   each of the first piezoelectric actuator and the second piezoelectric actuator further comprises a second piezoelectric layer coupled to the third sublayer of the elastic layer.

7. The micro-mirror assembly of claim 1, wherein the micro-mirror includes a gimbal structure.

8. The micro-mirror assembly of claim 1, wherein the first edge of the micro-mirror is coupled to the first piezoelectric actuator by a connection spring.

9. A piezoelectric actuator comprising:
   an anchor;
   an elastic layer having a first end coupled to the anchor, the elastic layer comprising:
      a solid sublayer including an elastic material; and
      a second sublayer including a plurality of cavities; and
   a piezoelectric layer on the second sublayer of the elastic layer, the piezoelectric layer comprising:
      a top electrode;
      a bottom electrode; and
      a piezoelectric material layer between the top electrode and the bottom electrode,
      wherein each of the plurality of cavities is characterized by a height greater than a threshold value or greater than a half of a thickness of the solid sublayer.

10. The piezoelectric actuator of claim 9, wherein the plurality of cavities includes a one-dimensional array or a two-dimensional array of cavities.

11. The piezoelectric actuator of claim 9, wherein the piezoelectric layer is in physical contact with the second sublayer of the elastic layer.

12. The piezoelectric actuator of claim 9, wherein:
   the elastic layer further comprises a top sublayer on the second sublayer; and
   the piezoelectric layer is in physical contact with the top sublayer of the elastic layer.

13. The piezoelectric actuator of claim 9, wherein:
   the elastic layer further comprises a third sublayer including a second plurality of cavities;
   the solid sublayer is between the second sublayer and the third sublayer; and
   the piezoelectric actuator further comprises a second piezoelectric layer coupled to the third sublayer of the elastic layer.

14. The piezoelectric actuator of claim 9, wherein:
   the elastic layer includes a second movable end opposing the first end; and
   the piezoelectric layer is configured to, upon receiving a voltage signal at the top electrode and the bottom electrode, bend the elastic layer such that the second movable end of the elastic layer oscillates at a resonant frequency.

15. The piezoelectric actuator of claim 14, wherein the resonant frequency is greater than 1 KHz.

16. The piezoelectric actuator of claim 9, wherein the elastic material includes at least one of polysilicon, silicon oxide, or silicon nitride.

17. The piezoelectric actuator of claim 9, wherein the piezoelectric material layer includes lead zirconate titanate ceramic.

18. The piezoelectric actuator of claim 9, wherein the anchor includes a substrate.

* * * * *